(12) United States Patent
Kim et al.

(10) Patent No.: US 12,238,439 B2
(45) Date of Patent: Feb. 25, 2025

(54) IMAGE SENSOR AND METHOD OF OPERATING THE IMAGE SENSOR

(71) Applicant: SAMSUNG ELECTRONICS CO., LTD., Suwon-si (KR)

(72) Inventors: Yunhong Kim, Suwon-si (KR); Mooyoung Kim, Suwon-si (KR); Takahiko Inada, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/417,279

(22) Filed: Jan. 19, 2024

(65) Prior Publication Data

US 2024/0251184 A1 Jul. 25, 2024

(30) Foreign Application Priority Data

Jan. 20, 2023 (KR) .................. 10-2023-0009031

(51) Int. Cl.
*H04N 25/766* (2023.01)
*H01L 27/146* (2006.01)
*H04N 25/772* (2023.01)

(52) U.S. Cl.
CPC ..... *H04N 25/766* (2023.01); *H01L 27/14603* (2013.01); *H04N 25/772* (2023.01)

(58) Field of Classification Search
CPC .................................................. H04N 25/766
See application file for complete search history.

(56) References Cited

U.S. PATENT DOCUMENTS

| 7,488,928 | B2 | 2/2009 | Krymski | |
|---|---|---|---|---|
| 8,002,188 | B2 | 8/2011 | Wang | |
| 9,064,769 | B2 | 6/2015 | Kozlowski | |
| 2008/0055436 | A1* | 3/2008 | Sarwari | H04N 25/134 348/E9.01 |
| 2013/0070121 | A1 | 3/2013 | Gu et al. | |
| 2013/0087683 | A1 | 4/2013 | Mo et al. | |
| 2013/0195273 | A1 | 8/2013 | Lord | |
| 2014/0239161 | A1 | 8/2014 | Meynants et al. | |

* cited by examiner

*Primary Examiner* — Thanh Luu
(74) *Attorney, Agent, or Firm* — F. CHAU & ASSOCIATES, LLC

(57) ABSTRACT

An image sensor including a row driver configured to provide, at a first time, a control signal to first pixels in a first group having n consecutive odd horizontal lines, provide, at a second time, the control signal to pixels in a second group having n consecutive even horizontal lines, and provide, at a third time, the control signal to pixels in a third group having n consecutive odd horizontal lines, and having a first horizontal line next to a last horizontal line of the first group, wherein each of the n horizontal lines of the first group is separated by an at least three-row interval from a corresponding one of the n horizontal lines of the second group, and a time interval between the first time point and the second time point is equal to a time interval between the second time point and the third time point.

12 Claims, 39 Drawing Sheets

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 | t2 | t1 | t2 | t1 | t2 | t1 | t2 | t1 | t2 | t1 | t2 | t1 | t2 | t1 | RG1 |
| R2 | t4 | t3 | t4 | t3 | t4 | t3 | t4 | t3 | t4 | t3 | t4 | t3 | t4 | t3 | t4 | RG2 |
| R3 | t1 | t2 | t1 | t2 | t1 | t2 | t1 | t2 | t1 | t2 | t1 | t2 | t1 | t2 | t1 | RG1 |
| R4 | t4 | t3 | t4 | t3 | t4 | t3 | t4 | t3 | t4 | t3 | t4 | t3 | t4 | t3 | t4 | RG2 |
| R5 | t5 | t6 | t5 | t6 | t5 | t6 | t5 | t6 | t5 | t6 | t5 | t6 | t5 | t6 | t5 | |
| R6 | t8 | t7 | t8 | t7 | t8 | t7 | t8 | t7 | t8 | t7 | t8 | t7 | t8 | t7 | t8 | |
| R7 | t5 | t6 | t5 | t6 | t5 | t6 | t5 | t6 | t5 | t6 | t5 | t6 | t5 | t6 | t5 | |
| R8 | t8 | t7 | t8 | t7 | t8 | t7 | t8 | t7 | t8 | t7 | t8 | t7 | t8 | t7 | t8 | |
| R9 | t9 | t10 | t9 | t10 | t9 | t10 | t9 | t10 | t9 | t10 | t9 | t10 | t9 | t10 | t9 | |
| R10 | t12 | t11 | t12 | t11 | t12 | t11 | t12 | t11 | t12 | t11 | t12 | t11 | t12 | t11 | t12 | |
| R11 | t9 | t10 | t9 | t10 | t9 | t10 | t9 | t10 | t9 | t10 | t9 | t10 | t9 | t10 | t9 | |
| R12 | t12 | t11 | t12 | t11 | t12 | t11 | t12 | t11 | t12 | t11 | t12 | t11 | t12 | t11 | t12 | |
| R13 | t13 | t14 | t13 | t14 | t13 | t14 | t13 | t14 | t13 | t14 | t13 | t14 | t13 | t14 | t13 | |

|    | C1 | C2 | C3 | C4 | C5 | C6 | C7 | C8 | C9 | C10 | C11 | C12 | C13 | C14 | C15 |
|----|----|----|----|----|----|----|----|----|----|-----|-----|-----|-----|-----|-----|
| R1 | t1 | t2 | t1 | t2 | t1 | t2 | t1 | t2 | t1 | t2  | t1  | t2  | t1  | t2  | t1  |
| R2 |    |    |    |    |    |    |    |    |    |     |     |     |     |     |     |
| R3 | t1 | t2 | t1 | t2 | t1 | t2 | t1 | t2 | t1 | t2  | t1  | t2  | t1  | t2  | t1  |
| R4 | t4 | t3 | t4 | t3 | t4 | t3 | t4 | t3 | t4 | t3  | t4  | t3  | t4  | t3  | t4  |
| R5 |    |    |    |    |    |    |    |    |    |     |     |     |     |     |     |
| R6 | t4 | t3 | t4 | t3 | t4 | t3 | t4 | t3 | t4 | t3  | t4  | t3  | t4  | t3  | t4  |
| R7 |    |    |    |    |    |    |    |    |    |     |     |     |     |     |     |
| R8 |    |    |    |    |    |    |    |    |    |     |     |     |     |     |     |
| R9 |    |    |    |    |    |    |    |    |    |     |     |     |     |     |     |
| R10 |   |    |    |    |    |    |    |    |    |     |     |     |     |     |     |
| R11 |   |    |    |    |    |    |    |    |    |     |     |     |     |     |     |
| R12 |   |    |    |    |    |    |    |    |    |     |     |     |     |     |     |
| R13 |   |    |    |    |    |    |    |    |    |     |     |     |     |     |     |

|  | C1 | C2 | C3 | C4 | C5 | C6 | C7 | C8 | C9 | C10 | C11 | C12 | C13 | C14 | C15 |  |
|---|---|---|---|---|---|---|---|---|---|---|---|---|---|---|---|---|
| R1 | t1 | t2 | t1 | t2 | t1 | t2 | t1 | t2 | t1 | t2 | t1 | t2 | t1 | t2 | t1 | } Dummy row line |
| R2 |  |  |  |  |  |  |  |  |  |  |  |  |  |  |  |  |
| R3 | t1 | t2 | t1 | t2 | t1 | t2 | t1 | t2 | t1 | t2 | t1 | t2 | t1 | t2 | t1 |  |
| R4 | t4 | t3 | t4 | t3 | t4 | t3 | t4 | t3 | t4 | t3 | t4 | t3 | t4 | t3 | t4 |  |
| R5 | t5 | t6 | t5 | t6 | t5 | t6 | t5 | t6 | t5 | t6 | t5 | t6 | t5 | t6 | t5 |  |
| R6 | t4 | t3 | t4 | t3 | t4 | t3 | t4 | t3 | t4 | t3 | t4 | t3 | t4 | t3 | t4 |  |
| R7 | t5 | t6 | t5 | t6 | t5 | t6 | t5 | t6 | t5 | t6 | t5 | t6 | t5 | t6 | t5 |  |
| R8 | t8 | t7 | t8 | t7 | t8 | t7 | t8 | t7 | t8 | t7 | t8 | t7 | t8 | t7 | t8 |  |
| R9 | t9 | t10 | t9 | t10 | t9 | t10 | t9 | t10 | t9 | t10 | t9 | t10 | t9 | t10 | t9 |  |
| R10 | t8 | t7 | t8 | t7 | t8 | t7 | t8 | t7 | t8 | t7 | t8 | t7 | t8 | t7 | t8 |  |
| R11 | t9 | t10 | t9 | t10 | t9 | t10 | t9 | t10 | t9 | t10 | t9 | t10 | t9 | t10 | t9 |  |
| R12 | t12 | t11 | t12 | t11 | t12 | t11 | t12 | t11 | t12 | t11 | t12 | t11 | t12 | t11 | t12 |  |
| R13 | t14 | t13 | t14 | t13 | t14 | t13 | t14 | t13 | t14 | t13 | t14 | t13 | t14 | t13 | t14 |  |

|     | C1 | C2 | C3 | C4 | C5 | C6 | C7 | C8 | C9 | C10 | C11 | C12 | C13 | C14 | C15 |     |
|-----|----|----|----|----|----|----|----|----|----|-----|-----|-----|-----|-----|-----|-----|
| R1  | t1 |    | t1 |    | t1 |    | t1 |    | t1 |     | t1  |     | t1  |     | t1  | —RG1 |
| R2  |    |    |    |    |    |    |    |    |    |     |     |     |     |     |     |     |
| R3  | t1 |    | t1 |    | t1 |    | t1 |    | t1 |     | t1  |     | t1  |     | t1  | —RG1 |
| R4  |    |    |    |    |    |    |    |    |    |     |     |     |     |     |     |     |
| R5  | t1 |    | t1 |    | t1 |    | t1 |    | t1 |     | t1  |     | t1  |     | t1  | —RG1 |
| R6  |    |    |    |    |    |    |    |    |    |     |     |     |     |     |     |     |
| R7  |    |    |    |    |    |    |    |    |    |     |     |     |     |     |     |     |
| R8  |    |    |    |    |    |    |    |    |    |     |     |     |     |     |     |     |
| R9  |    |    |    |    |    |    |    |    |    |     |     |     |     |     |     |     |
| R10 |    |    |    |    |    |    |    |    |    |     |     |     |     |     |     |     |
| R11 |    |    |    |    |    |    |    |    |    |     |     |     |     |     |     |     |
| R12 |    |    |    |    |    |    |    |    |    |     |     |     |     |     |     |     |
| R13 |    |    |    |    |    |    |    |    |    |     |     |     |     |     |     |     |

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 | | t1 | | t1 | | t1 | | t1 | | t1 | | t1 | | t1 | |
| R2 | | | | | | | | | | | | | | | | |
| R3 | t1 | t2 | t1 | t2 | t1 | t2 | t1 | t2 | t1 | t2 | t1 | t2 | t1 | t2 | t1 | — RG2 |
| R4 | | | | | | | | | | | | | | | | |
| R5 | t1 | t2 | t1 | t2 | t1 | t2 | t1 | t2 | t1 | t2 | t1 | t2 | t1 | t2 | t1 | — RG2 |
| R6 | | | | | | | | | | | | | | | | |
| R7 | | t2 | | t2 | | t2 | | t2 | | t2 | | t2 | | t2 | | — RG2 |
| R8 | | | | | | | | | | | | | | | | |
| R9 | | | | | | | | | | | | | | | | |
| R10 | | | | | | | | | | | | | | | | |
| R11 | | | | | | | | | | | | | | | | |
| R12 | | | | | | | | | | | | | | | | |
| R13 | | | | | | | | | | | | | | | | |

|    | C1 | C2 | C3 | C4 | C5 | C6 | C7 | C8 | C9 | C10 | C11 | C12 | C13 | C14 | C15 |     |
|----|----|----|----|----|----|----|----|----|----|-----|-----|-----|-----|-----|-----|-----|
| R1 | t1 |    | t1 |    | t1 |    | t1 |    | t1 |     | t1  |     | t1  |     | t1  |     |
| R2 |    |    |    |    |    |    |    |    |    |     |     |     |     |     |     |     |
| R3 | t1 | t2 | t1 | t2 | t1 | t2 | t1 | t2 | t1 | t2  | t1  | t2  | t1  | t2  | t1  |     |
| R4 | t4 | t3 | t4 | t3 | t4 | t3 | t4 | t3 | t4 | t3  | t4  | t3  | t4  | t3  | t4  | —RG3 |
| R5 | t1 | t2 | t1 | t2 | t1 | t2 | t1 | t2 | t1 | t2  | t1  | t2  | t1  | t2  | t1  |     |
| R6 | t4 | t3 | t4 | t3 | t4 | t3 | t4 | t3 | t4 | t3  | t4  | t3  | t4  | t3  | t4  | —RG3 |
| R7 |    | t2 |    | t2 |    | t2 |    | t2 |    | t2  |     | t2  |     | t2  |     |     |
| R8 | t4 | t3 | t4 | t3 | t4 | t3 | t4 | t3 | t4 | t3  | t4  | t3  | t4  | t3  | t4  | —RG3 |
| R9 |    |    |    |    |    |    |    |    |    |     |     |     |     |     |     |     |
| R10|    |    |    |    |    |    |    |    |    |     |     |     |     |     |     |     |
| R11|    |    |    |    |    |    |    |    |    |     |     |     |     |     |     |     |
| R12|    |    |    |    |    |    |    |    |    |     |     |     |     |     |     |     |
| R13|    |    |    |    |    |    |    |    |    |     |     |     |     |     |     |     |

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 | | t1 | | t1 | | t1 | | t1 | | t1 | | t1 | | t1 | ⎫ Dummy |
| R2 | | | | | | | | | | | | | | | | ⎭ row line |
| R3 | t1 | t2 | t1 | t2 | t1 | t2 | t1 | t2 | t1 | t2 | t1 | t2 | t1 | t2 | t1 | |
| R4 | t4 | t3 | t4 | t3 | t4 | t3 | t4 | t3 | t4 | t3 | t4 | t3 | t4 | t3 | t4 | |
| R5 | t1 | t2 | t1 | t2 | t1 | t2 | t1 | t2 | t1 | t2 | t1 | t2 | t1 | t2 | t1 | |
| R6 | t4 | t3 | t4 | t3 | t4 | t3 | t4 | t3 | t4 | t3 | t4 | t3 | t4 | t3 | t4 | |
| R7 | t5 | t2 | t5 | t2 | t5 | t2 | t5 | t2 | t5 | t2 | t5 | t2 | t5 | t2 | t5 | |
| R8 | t4 | t3 | t4 | t3 | t4 | t3 | t4 | t3 | t4 | t3 | t4 | t3 | t4 | t3 | t4 | |
| R9 | t5 | t6 | t5 | t6 | t5 | t6 | t5 | t6 | t5 | t6 | t5 | t6 | t5 | t6 | t5 | |
| R10 | t8 | t7 | t8 | t7 | t8 | t7 | t8 | t7 | t8 | t7 | t8 | t7 | t8 | t7 | t8 | |
| R11 | t5 | t6 | t5 | t6 | t5 | t6 | t5 | t6 | t5 | t6 | t5 | t6 | t5 | t6 | t5 | |
| R12 | t8 | t7 | t8 | t7 | t8 | t7 | t8 | t7 | t8 | t7 | t8 | t7 | t8 | t7 | t8 | |
| R13 | t9 | t6 | t9 | t6 | t9 | t6 | t9 | t6 | t9 | t6 | t9 | t6 | t9 | t6 | t9 | |

|  | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 |  | t1 |  | t1 |  | t1 |  | t1 |  | t1 |  | t1 |  | t1 | — RG1 |
| R2 |  |  |  |  |  |  |  |  |  |  |  |  |  |  |  | |
| R3 | t1 |  | t1 |  | t1 |  | t1 |  | t1 |  | t1 |  | t1 |  | t1 | — RG1 |
| R4 |  |  |  |  |  |  |  |  |  |  |  |  |  |  |  | |
| R5 | t1 |  | t1 |  | t1 |  | t1 |  | t1 |  | t1 |  | t1 |  | t1 | — RG1 |
| R6 |  |  |  |  |  |  |  |  |  |  |  |  |  |  |  | |
| R7 | t1 |  | t1 |  | t1 |  | t1 |  | t1 |  | t1 |  | t1 |  | t1 | — RG1 |
| R8 |  |  |  |  |  |  |  |  |  |  |  |  |  |  |  | |
| R9 |  |  |  |  |  |  |  |  |  |  |  |  |  |  |  | |
| R10 |  |  |  |  |  |  |  |  |  |  |  |  |  |  |  | |
| R11 |  |  |  |  |  |  |  |  |  |  |  |  |  |  |  | |
| R12 |  |  |  |  |  |  |  |  |  |  |  |  |  |  |  | |
| R13 |  |  |  |  |  |  |  |  |  |  |  |  |  |  |  | |
| R14 |  |  |  |  |  |  |  |  |  |  |  |  |  |  |  | |
| R15 |  |  |  |  |  |  |  |  |  |  |  |  |  |  |  | |
| R16 |  |  |  |  |  |  |  |  |  |  |  |  |  |  |  | |

|     | C1 | C2 | C3 | C4 | C5 | C6 | C7 | C8 | C9 | C10 | C11 | C12 | C13 | C14 | C15 |     |
| --- | -- | -- | -- | -- | -- | -- | -- | -- | -- | --- | --- | --- | --- | --- | --- | --- |
| R1  | t1 |    | t1 |    | t1 |    | t1 |    | t1 |     | t1  |     | t1  |     | t1  |     |
| R2  |    |    |    |    |    |    |    |    |    |     |     |     |     |     |     |     |
| R3  | t1 | t2 | t1 | t2 | t1 | t2 | t1 | t2 | t1 | t2  | t1  | t2  | t1  | t2  | t1  | — RG2 |
| R4  |    |    |    |    |    |    |    |    |    |     |     |     |     |     |     |     |
| R5  | t1 | t2 | t1 | t2 | t1 | t2 | t1 | t2 | t1 | t2  | t1  | t2  | t1  | t2  | t1  | — RG2 |
| R6  |    |    |    |    |    |    |    |    |    |     |     |     |     |     |     |     |
| R7  | t1 | t2 | t1 | t2 | t1 | t2 | t1 | t2 | t1 | t2  | t1  | t2  | t1  | t2  | t1  | — RG2 |
| R8  |    |    |    |    |    |    |    |    |    |     |     |     |     |     |     |     |
| R9  |    | t2 |    | t2 |    | t2 |    | t2 |    | t2  |     | t2  |     | t2  |     | — RG2 |
| R10 |    |    |    |    |    |    |    |    |    |     |     |     |     |     |     |     |
| R11 |    |    |    |    |    |    |    |    |    |     |     |     |     |     |     |     |
| R12 |    |    |    |    |    |    |    |    |    |     |     |     |     |     |     |     |
| R13 |    |    |    |    |    |    |    |    |    |     |     |     |     |     |     |     |
| R14 |    |    |    |    |    |    |    |    |    |     |     |     |     |     |     |     |
| R15 |    |    |    |    |    |    |    |    |    |     |     |     |     |     |     |     |
| R16 |    |    |    |    |    |    |    |    |    |     |     |     |     |     |     |     |

FIG. 11C

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 | | t1 | | t1 | | t1 | | t1 | | t1 | | t1 | | t1 | |
| R2 | | | | | | | | | | | | | | | | |
| R3 | t1 | t2 | t1 | t2 | t1 | t2 | t1 | t2 | t1 | t2 | t1 | t2 | t1 | t2 | t1 | |
| R4 | | | | | | | | | | | | | | | | |
| R5 | t1 | t2 | t1 | t2 | t1 | t2 | t1 | t2 | t1 | t2 | t1 | t2 | t1 | t2 | t1 | |
| R6 | | t3 | | t3 | | t3 | | t3 | | t3 | | t3 | | t3 | | — RG3 |
| R7 | t1 | t2 | t1 | t2 | t1 | t2 | t1 | t2 | t1 | t2 | t1 | t2 | t1 | t2 | t1 | |
| R8 | | t3 | | t3 | | t3 | | t3 | | t3 | | t3 | | t3 | | — RG3 |
| R9 | | t2 | | t2 | | t2 | | t2 | | t2 | | t2 | | t2 | | |
| R10 | | t3 | | t3 | | t3 | | t3 | | t3 | | t3 | | t3 | | — RG3 |
| R11 | | | | | | | | | | | | | | | | |
| R12 | | t3 | | t3 | | t3 | | t3 | | t3 | | t3 | | t3 | | — RG3 |
| R13 | | | | | | | | | | | | | | | | |
| R14 | | | | | | | | | | | | | | | | |
| R15 | | | | | | | | | | | | | | | | |
| R16 | | | | | | | | | | | | | | | | |

|     | C1 | C2 | C3 | C4 | C5 | C6 | C7 | C8 | C9 | C10 | C11 | C12 | C13 | C14 | C15 |      |
|-----|----|----|----|----|----|----|----|----|----|-----|-----|-----|-----|-----|-----|------|
| R1  | t1 |    | t1 |    | t1 |    | t1 |    | t1 |     | t1  |     | t1  |     | t1  |      |
| R2  |    |    |    |    |    |    |    |    |    |     |     |     |     |     |     |      |
| R3  | t1 | t2 | t1 | t2 | t1 | t2 | t1 | t2 | t1 | t2  | t1  | t2  | t1  | t2  | t1  |      |
| R4  |    |    |    |    |    |    |    |    |    |     |     |     |     |     |     |      |
| R5  | t1 | t2 | t1 | t2 | t1 | t2 | t1 | t2 | t1 | t2  | t1  | t2  | t1  | t2  | t1  |      |
| R6  |    | t3 |    | t3 |    | t3 |    | t3 |    | t3  |     | t3  |     | t3  |     |      |
| R7  | t1 | t2 | t1 | t2 | t1 | t2 | t1 | t2 | t1 | t2  | t1  | t2  | t1  | t2  | t1  |      |
| R8  | t4 | t3 | t4 | t3 | t4 | t3 | t4 | t3 | t4 | t3  | t4  | t3  | t4  | t3  | t4  | —RG4 |
| R9  |    | t2 |    | t2 |    | t2 |    | t2 |    | t2  |     | t2  |     | t2  |     |      |
| R10 | t4 | t3 | t4 | t3 | t4 | t3 | t4 | t3 | t4 | t3  | t4  | t3  | t4  | t3  | t4  | —RG4 |
| R11 |    |    |    |    |    |    |    |    |    |     |     |     |     |     |     |      |
| R12 | t4 | t3 | t4 | t3 | t4 | t3 | t4 | t3 | t4 | t3  | t4  | t3  | t4  | t3  | t4  | —RG4 |
| R13 |    |    |    |    |    |    |    |    |    |     |     |     |     |     |     |      |
| R14 | t4 |    | t4 |    | t4 |    | t4 |    | t4 |     | t4  |     | t4  |     | t4  | —RG4 |
| R15 |    |    |    |    |    |    |    |    |    |     |     |     |     |     |     |      |
| R16 |    |    |    |    |    |    |    |    |    |     |     |     |     |     |     |      |

|  | C1 | C2 | C3 | C4 | C5 | C6 | C7 | C8 | C9 | C10 | C11 | C12 | C13 | C14 | C15 |  |
|---|---|---|---|---|---|---|---|---|---|---|---|---|---|---|---|---|
| PU1 R1 | t1 |  | t1 |  | t1 |  | t1 |  | t1 |  | t1 |  | t1 |  | t1 | ⎫ |
| R2 |  |  |  |  |  |  |  |  |  |  |  |  |  |  |  | ⎪ |
| PU2 R3 | t1 | t2 | t1 | t2 | t1 | t2 | t1 | t2 | t1 | t2 | t1 | t2 | t1 | t2 | t1 | ⎬ Dummy row line |
| R4 |  |  |  |  |  |  |  |  |  |  |  |  |  |  |  | ⎪ |
| PU3 R5 | t1 | t2 | t1 | t2 | t1 | t2 | t1 | t2 | t1 | t2 | t1 | t2 | t1 | t2 | t1 | ⎪ |
| R6 |  | t3 |  | t3 |  | t3 |  | t3 |  | t3 |  | t3 |  | t3 |  | ⎭ |
| PU4 R7 | t1 | t2 | t1 | t2 | t1 | t2 | t1 | t2 | t1 | t2 | t1 | t2 | t1 | t2 | t1 |  |
| R8 | t4 | t3 | t4 | t3 | t4 | t3 | t4 | t3 | t4 | t3 | t4 | t3 | t4 | t3 | t4 |  |
| PU5 R9 | t5 | t2 | t5 | t2 | t5 | t2 | t5 | t2 | t5 | t2 | t5 | t2 | t5 | t2 | t5 |  |
| R10 | t4 | t3 | t4 | t3 | t4 | t3 | t4 | t3 | t4 | t3 | t4 | t3 | t4 | t3 | t4 |  |
| PU6 R11 | t5 | t6 | t5 | t6 | t5 | t6 | t5 | t6 | t5 | t6 | t5 | t6 | t5 | t6 | t5 |  |
| R12 | t4 | t3 | t4 | t3 | t4 | t3 | t4 | t3 | t4 | t3 | t4 | t3 | t4 | t3 | t4 |  |
| PU7 R13 | t5 | t6 | t5 | t6 | t5 | t6 | t5 | t6 | t5 | t6 | t5 | t6 | t5 | t6 | t5 |  |
| R14 | t4 | t7 | t4 | t7 | t4 | t7 | t4 | t7 | t4 | t7 | t4 | t7 | t4 | t7 | t4 |  |
| PU8 R15 | t5 | t6 | t5 | t6 | t5 | t6 | t5 | t6 | t5 | t6 | t5 | t6 | t5 | t6 | t5 |  |
| R16 | t8 | t7 | t8 | t7 | t8 | t7 | t8 | t7 | t8 | t7 | t8 | t7 | t8 | t7 | t8 |  |

|  | C1 | C2 | C3 | C4 | C5 | C6 | C7 | C8 | C9 | C10 | C11 | C12 | C13 | C14 | C15 |
|---|---|---|---|---|---|---|---|---|---|---|---|---|---|---|---|
| PU1 { R1 | t1 |  | t1 |  | t1 |  | t1 |  | t1 |  | t1 |  | t1 |  | t1 |
| R2 |  |  |  |  |  |  |  |  |  |  |  |  |  |  |  |
| PU2 { R3 | t1 | t2 | t1 | t2 | t1 | t2 | t1 | t2 | t1 | t2 | t1 | t2 | t1 | t2 | t1 |
| R4 |  |  |  |  |  |  |  |  |  |  |  |  |  |  |  |
| PU3 { R5 | t1 | t2 | t1 | t2 | t1 | t2 | t1 | t2 | t1 | t2 | t1 | t2 | t1 | t2 | t1 |
| R6 | t4 | t3 | t4 | t3 | t4 | t3 | t4 | t3 | t4 | t3 | t4 | t3 | t4 | t3 | t4 |
| PU4 { R7 | t1 | t2 | t1 | t2 | t1 | t2 | t1 | t2 | t1 | t2 | t1 | t2 | t1 | t2 | t1 |
| R8 | t4 | t3 | t4 | t3 | t4 | t3 | t4 | t3 | t4 | t3 | t4 | t3 | t4 | t3 | t4 |
| PU5 { R9 | t5 | t2 | t5 | t2 | t5 | t2 | t5 | t2 | t5 | t2 | t5 | t2 | t5 | t2 | t5 |
| R10 | t4 | t3 | t4 | t3 | t4 | t3 | t4 | t3 | t4 | t3 | t4 | t3 | t4 | t3 | t4 |
| PU6 { R11 | t5 | t6 | t5 | t6 | t5 | t6 | t5 | t6 | t5 | t6 | t5 | t6 | t5 | t6 | t5 |
| R12 | t4 | t3 | t4 | t3 | t4 | t3 | t4 | t3 | t4 | t3 | t4 | t3 | t4 | t3 | t4 |
| PU7 { R13 | t5 | t6 | t5 | t6 | t5 | t6 | t5 | t6 | t5 | t6 | t5 | t6 | t5 | t6 | t5 |
| R14 | t8 | t7 | t8 | t7 | t8 | t7 | t8 | t7 | t8 | t7 | t8 | t7 | t8 | t7 | t8 |
| PU8 { R15 | t5 | t6 | t5 | t6 | t5 | t6 | t5 | t6 | t5 | t6 | t5 | t6 | t5 | t6 | t5 |
| R16 | t8 | t7 | t8 | t7 | t8 | t7 | t8 | t7 | t8 | t7 | t8 | t7 | t8 | t7 | t8 |

Dummy row line (rows R1–R4)

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| PU1 R1 | t1 | t7 | t1 | t7 | t1 | t7 | t1 | t7 | t1 | t7 | t1 | t7 | t1 | t7 | t1 | RG1 |
| R2 | t3 | t5 | t3 | t5 | t3 | t5 | t3 | t5 | t3 | t5 | t3 | t5 | t3 | t5 | t3 | RG3 |
| PU2 R3 | t2 | t8 | t2 | t8 | t2 | t8 | t2 | t8 | t2 | t8 | t2 | t8 | t2 | t8 | t2 | RG2 |
| R4 | t4 | t6 | t4 | t6 | t4 | t6 | t4 | t6 | t4 | t6 | t4 | t6 | t4 | t6 | t4 | RG4 |
| PU3 R5 | t1 | t7 | t1 | t7 | t1 | t7 | t1 | t7 | t1 | t7 | t1 | t7 | t1 | t7 | t1 | RG1 |
| R6 | t3 | t5 | t3 | t5 | t3 | t5 | t3 | t5 | t3 | t5 | t3 | t5 | t3 | t5 | t3 | RG3 |
| PU4 R7 | t2 | t8 | t2 | t8 | t2 | t8 | t2 | t8 | t2 | t8 | t2 | t8 | t2 | t8 | t2 | RG2 |
| R8 | t4 | t6 | t4 | t6 | t4 | t6 | t4 | t6 | t4 | t6 | t4 | t6 | t4 | t6 | t4 | RG4 |
| PU5 R9 | t9 | t15 | t9 | t15 | t9 | t15 | t9 | t15 | t9 | t15 | t9 | t15 | t9 | t15 | t9 | |
| R10 | t11 | t13 | t11 | t13 | t11 | t13 | t11 | t13 | t11 | t13 | t11 | t13 | t11 | t13 | t11 | |
| PU6 R11 | t10 | t16 | t10 | t16 | t10 | t16 | t10 | t16 | t10 | t16 | t10 | t16 | t10 | t16 | t10 | |
| R12 | t12 | t14 | t12 | t14 | t12 | t14 | t12 | t14 | t12 | t14 | t12 | t14 | t12 | t14 | t12 | |
| PU7 R13 | t9 | t15 | t9 | t15 | t9 | t15 | t9 | t15 | t9 | t15 | t9 | t15 | t9 | t15 | t9 | |
| R14 | t11 | t13 | t11 | t13 | t11 | t13 | t11 | t13 | t11 | t13 | t11 | t13 | t11 | t13 | t11 | |
| PU8 R15 | t10 | t16 | t10 | t16 | t10 | t16 | t10 | t16 | t10 | t16 | t10 | t16 | t10 | t16 | t10 | |
| R16 | t12 | t14 | t12 | t14 | t12 | t14 | t12 | t14 | t12 | t14 | t12 | t14 | t12 | t14 | t12 | |

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 | | t1 | | t1 | | t1 | | t1 | | t1 | | t1 | | t1 | —RG1 |
| R2 | | | | | | | | | | | | | | | | |
| R3 | t2 | | t2 | | t2 | | t2 | | t2 | | t2 | | t2 | | t2 | —RG2 |
| R4 | t3 | | t3 | | t3 | | t3 | | t3 | | t3 | | t3 | | t3 | —RG3 |
| R5 | t1 | | t1 | | t1 | | t1 | | t1 | | t1 | | t1 | | t1 | —RG1 |
| R6 | t4 | t5 | t4 | t5 | t4 | t5 | t4 | t5 | t4 | t5 | t4 | t5 | t4 | t5 | t4 | —RG4 |
| R7 | t2 | | t2 | | t2 | | t2 | | t2 | | t2 | | t2 | | t2 | —RG2 |
| R8 | t3 | | t3 | | t3 | | t3 | | t3 | | t3 | | t3 | | t3 | —RG3 |
| R9 | | | | | | | | | | | | | | | | |
| R10 | t4 | t5 | t4 | t5 | t4 | t5 | t4 | t5 | t4 | t5 | t4 | t5 | t4 | t5 | t4 | —RG4 |
| R11 | | | | | | | | | | | | | | | | |
| R12 | | | | | | | | | | | | | | | | |
| R13 | | | | | | | | | | | | | | | | |
| R14 | | | | | | | | | | | | | | | | |
| R15 | | | | | | | | | | | | | | | | |
| R16 | | | | | | | | | | | | | | | | |

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 | | t1 | | t1 | | t1 | | t1 | | t1 | | t1 | | t1 | |
| R2 | | | | | | | | | | | | | | | | |
| R3 | t2 | | t2 | | t2 | | t2 | | t2 | | t2 | | t2 | | t2 | |
| R4 | t3 | | t3 | | t3 | | t3 | | t3 | | t3 | | t3 | | t3 | |
| R5 | t1 | t7 | t1 | t7 | t1 | t7 | t1 | t7 | t1 | t7 | t1 | t7 | t1 | t7 | t1 | — RG6 |
| R6 | t4 | t5 | t4 | t5 | t4 | t5 | t4 | t5 | t4 | t5 | t4 | t5 | t4 | t5 | t4 | |
| R7 | t2 | t8 | t2 | t8 | t2 | t8 | t2 | t8 | t2 | t8 | t2 | t8 | t2 | t8 | t2 | — RG7 |
| R8 | t3 | t6 | t3 | t6 | t3 | t6 | t3 | t6 | t3 | t6 | t3 | t6 | t3 | t6 | t3 | — RG5 |
| R9 | t9 | t7 | t9 | t7 | t9 | t7 | t9 | t7 | t9 | t7 | t9 | t7 | t9 | t7 | t9 | — RG6,8 |
| R10 | t4 | t5 | t4 | t5 | t4 | t5 | t4 | t5 | t4 | t5 | t4 | t5 | t4 | t5 | t4 | |
| R11 | | t8 | | t8 | | t8 | | t8 | | t8 | | t8 | | t8 | | — RG7 |
| R12 | | t6 | | t6 | | t6 | | t6 | | t6 | | t6 | | t6 | | — RG5 |
| R13 | t9 | | t9 | | t9 | | t9 | | t9 | | t9 | | t9 | | t9 | — RG8 |
| R14 | | | | | | | | | | | | | | | | |
| R15 | | | | | | | | | | | | | | | | |
| R16 | | | | | | | | | | | | | | | | |

FIG. 14C

| | C1 | C2 | C3 | C4 | C5 | C6 | C7 | C8 | C9 | C10 | C11 | C12 | C13 | C14 | C15 |
|---|---|---|---|---|---|---|---|---|---|---|---|---|---|---|---|
| R1 | t1 | | t1 | | t1 | | t1 | | t1 | | t1 | | t1 | | t1 |
| R2 | | | | | | | | | | | | | | | |
| R3 | t2 | | t2 | | t2 | | t2 | | t2 | | t2 | | t2 | | t2 |
| R4 | t3 | | t3 | | t3 | | t3 | | t3 | | t3 | | t3 | | t3 |
| R5 | t1 | t7 | t1 | t7 | t1 | t7 | t1 | t7 | t1 | t7 | t1 | t7 | t1 | t7 | t1 |
| R6 | t4 | t5 | t4 | t5 | t4 | t5 | t4 | t5 | t4 | t5 | t4 | t5 | t4 | t5 | t4 |
| R7 | t2 | t8 | t2 | t8 | t2 | t8 | t2 | t8 | t2 | t8 | t2 | t8 | t2 | t8 | t2 |
| R8 | t3 | t6 | t3 | t6 | t3 | t6 | t3 | t6 | t3 | t6 | t3 | t6 | t3 | t6 | t3 |
| R9 | t9 | t7 | t9 | t7 | t9 | t7 | t9 | t7 | t9 | t7 | t9 | t7 | t9 | t7 | t9 |
| R10 | t4 | t5 | t4 | t5 | t4 | t5 | t4 | t5 | t4 | t5 | t4 | t5 | t4 | t5 | t4 |
| R11 | t10 | t8 | t10 | t8 | t10 | t8 | t10 | t8 | t10 | t8 | t10 | t8 | t10 | t8 | t10 |
| R12 | t11 | t7 | t11 | t7 | t11 | t7 | t11 | t7 | t11 | t7 | t11 | t7 | t11 | t7 | t11 |
| R13 | t9 | t15 | t9 | t15 | t9 | t15 | t9 | t15 | t9 | t15 | t9 | t15 | t9 | t15 | t9 |
| R14 | t11 | t13 | t11 | t13 | t11 | t13 | t11 | t13 | t11 | t13 | t11 | t13 | t11 | t13 | t11 |
| R15 | t10 | t16 | t10 | t16 | t10 | t16 | t10 | t16 | t10 | t16 | t10 | t16 | t10 | t16 | t10 |
| R16 | t11 | t14 | t11 | t14 | t11 | t14 | t11 | t14 | t11 | t14 | t11 | t14 | t11 | t14 | t11 |

FIG. 15A

| | C1 | C2 | C3 | C4 | C5 | C6 | C7 | C8 | C9 | C10 | C11 | C12 | C13 | C14 | C15 | |
|---|---|---|---|---|---|---|---|---|---|---|---|---|---|---|---|---|
| R1 | t1 | | t1 | | t1 | | t1 | | t1 | | t1 | | t1 | | t1 | |
| R2 | | | | | | | | | | | | | | | | |
| R3 | t3 | | t2 | | t2 | | t2 | | t2 | | t2 | | t2 | | t2 | Dummy row line |
| R4 | t2 | | t4 | | t4 | | t4 | | t4 | | t4 | | t4 | | t4 | |
| R5 | t1 | t6 | t1 | t6 | t1 | t6 | t1 | t6 | t1 | t6 | t1 | t6 | t1 | t6 | t1 | |
| R6 | t4 | t5 | t4 | t5 | t4 | t5 | t4 | t5 | t4 | t5 | t4 | t5 | t4 | t5 | t4 | |
| R7 | t3 | t8 | t3 | t8 | t3 | t8 | t3 | t8 | t3 | t8 | t3 | t8 | t3 | t8 | t3 | |
| R8 | t2 | t7 | t2 | t7 | t2 | t7 | t2 | t7 | t2 | t7 | t2 | t7 | t2 | t7 | t2 | |
| R9 | t9 | t6 | t9 | t6 | t9 | t6 | t9 | t6 | t9 | t6 | t9 | t6 | t9 | t6 | t9 | |
| R10 | t4 | t5 | t4 | t5 | t4 | t5 | t4 | t5 | t4 | t5 | t4 | t5 | t4 | t5 | t4 | |
| R11 | t11 | t8 | t11 | t8 | t11 | t8 | t11 | t8 | t11 | t8 | t11 | t8 | t11 | t8 | t11 | |
| R12 | t10 | t7 | t10 | t7 | t10 | t7 | t10 | t7 | t10 | t7 | t10 | t7 | t10 | t7 | t10 | |
| R13 | t9 | t14 | t9 | t14 | t9 | t14 | t9 | t14 | t9 | t14 | t9 | t14 | t9 | t14 | t9 | |
| R14 | t12 | t13 | t12 | t13 | t12 | t13 | t12 | t13 | t12 | t13 | t12 | t13 | t12 | t13 | t12 | |
| R15 | t11 | t16 | t11 | t16 | t11 | t16 | t11 | t16 | t11 | t16 | t11 | t16 | t11 | t16 | t11 | |
| R16 | t10 | t15 | t10 | t15 | t10 | t15 | t10 | t15 | t10 | t15 | t10 | t15 | t10 | t15 | t10 | |

110m

IMAGE SENSOR AND METHOD OF OPERATING THE IMAGE SENSOR

CROSS-REFERENCE TO RELATED APPLICATION

This application is based on and claims priority under 35 U.S.C. § 119 to Korean Patent Application No. 10-2023-0009031, filed on Jan. 20, 2023, in the Korean Intellectual Property Office, the disclosure of which is incorporated by reference herein in its entirety.

TECHNICAL FIELD

The inventive concept relates to an image sensor and a method of operating the image sensor.

DESCRIPTION OF RELATED ART

An image sensor is a device for capturing an image. For example, the image sensor may capture a two-dimensional or a three-dimensional image of an object. The image sensor may generate an image of the object by using a photoelectric conversion device. The photoelectric conversion device reacts according to an intensity of incident light reflected from the object.

To reduce an image generation time, a method of simultaneously reading several rows of sensor pixels may be used.

When simultaneously reading several rows of an image captured by a rolling shutter scheme in which sensor pixels may be read by row when exposed to incident light, flicker noise may occur.

SUMMARY

The inventive concept provides an image sensor and a method of operating the image sensor, wherein the image sensor alleviates and/or prevents flicker noise by reducing an interval between average readout times of a plurality of pixel units consecutively arranged in a column direction, wherein each pixel unit includes pixels arranged in a 2×2 array.

According to an aspect of the inventive concept, there is provided an image sensor.

The image sensor includes a plurality of horizontal lines extending in a first direction, a plurality of vertical lines extending in a second direction perpendicular to the first direction, a pixel array including a plurality of pixels arranged along the plurality of horizontal lines and the plurality of vertical lines, and a row driver configured to simultaneously provide a control signal to pixels included in n horizontal lines of the plurality of horizontal lines, wherein the row driver is further configured to provide, at a first time point, the control signal to first pixels in a first horizontal group including n consecutive odd horizontal lines of the plurality of horizontal lines, provide, at a second time point, the control signal to second pixels in a second horizontal group including n consecutive even horizontal lines of the plurality of horizontal lines, and provide, at a third time point, the control signal to third pixels in a third horizontal group which includes n consecutive odd horizontal lines of the plurality of horizontal lines, and of which a first horizontal line is an odd horizontal line next to a last horizontal line included in the first horizontal group, wherein each of the n horizontal lines included in the first horizontal group is separated by an at least three-row interval from a corresponding one of the n horizontal lines included in the second horizontal group, a time interval between the first time point and the second time point is equal to a time interval between the second time point and the third time point, and n is an integer greater than 1.

According to another aspect of the inventive concept, there is provided an image sensor.

The image sensor includes a plurality of horizontal lines extending in a first direction, a plurality of vertical lines extending in a second direction perpendicular to the first direction, a pixel array including a plurality of pixels arranged along the plurality of horizontal lines and the plurality of vertical lines, and a row driver configured to provide a control signal to simultaneously read pixels of n horizontal lines of the plurality of horizontal lines, wherein the row driver is further configured to provide, at a first time point, the control signal to pixels in a first horizontal group including n odd horizontal lines of the plurality of horizontal lines separated by a 2*m-row interval from each other, provide, at a second time point, the control signal to pixels in a second horizontal group including n even horizontal lines of the plurality of horizontal lines separated by the 2*m-row interval from each other, and provide, at a third time point, the control signal to pixels in a third horizontal group which includes n odd horizontal lines of the plurality of horizontal lines separated by the 2*m-row interval from each other, and of which the first horizontal line is an odd horizontal line of the plurality of horizontal lines separated by a 2*m*n-row interval from the first horizontal line included in a first horizontal group, each of the n horizontal lines included in a first horizontal group is separated by an at least three-row interval from a corresponding one of the n horizontal lines included in the second horizontal group, a time interval between the first time point and the second time point is equal to a time interval between the second time point and the third time point, and n and m are integers greater than 1.

According to another aspect of the inventive concept, there is provided a method of operating an image sensor.

The method of operating an image sensor including a plurality of pixels arranged along a plurality of horizontal lines and a plurality of vertical lines includes providing a control signal to first pixels in a first horizontal group including n consecutive odd horizontal lines of the plurality of horizontal lines, providing the control signal to second pixels in a second horizontal group including n consecutive even horizontal lines of the plurality of horizontal lines, and providing the control signal to third pixels in a third horizontal group which includes n consecutive odd horizontal lines of the plurality of horizontal lines, and of which a first horizontal line is an odd horizontal line next to a last horizontal line included in the first horizontal group, wherein each of the n consecutive odd horizontal lines included in the first horizontal group is separated by an at least three-row interval from a corresponding one of the n consecutive even horizontal lines included in the second horizontal group, a time interval between a time point at which the control signal is provided to the first pixels and a time point at which the control signal is provided to the second pixels is equal to a time interval between the time point at which the control signal is provided to the second pixels and a time point at which the control signal is provided to the third pixels, and n is an integer greater than 1.

BRIEF DESCRIPTION OF THE DRAWINGS

Embodiments of the inventive concept will be more clearly understood from the following detailed description taken in conjunction with the accompanying drawings in which:

FIG. 4 illustrates a pixel array according to an embodiment;

FIG. 7A, FIG. 7B, and FIG. 7C illustrate a readout scheme according to a comparative example;

FIG. 8A, FIG. 8B, FIG. 8C, FIG. 8D, FIG. 8E, and FIG. 8F illustrate a readout scheme according to an embodiment;

FIG. 9A, FIG. 9B, FIG. 9C, FIG. 9D, and FIG. 9E illustrate a readout scheme according to an embodiment;

FIG. 10A and FIG. 10B illustrate a readout scheme according to a comparative example;

FIG. 11A, FIG. 11B, FIG. 11C, FIG. 11D, FIG. 11E, and FIG. 11F illustrate a readout scheme according to an embodiment;

FIG. 12A and FIG. 12B illustrate a readout scheme according to an embodiment;

FIG. 13A and FIG. 13B illustrate a readout scheme according to a comparative example;

FIG. 14A, FIG. 14B, FIG. 14C, and FIG. 14D illustrate a readout scheme according to an embodiment;

FIG. 15A and FIG. 15B illustrate a readout scheme according to an embodiment.

DETAILED DESCRIPTION

Figure 1:
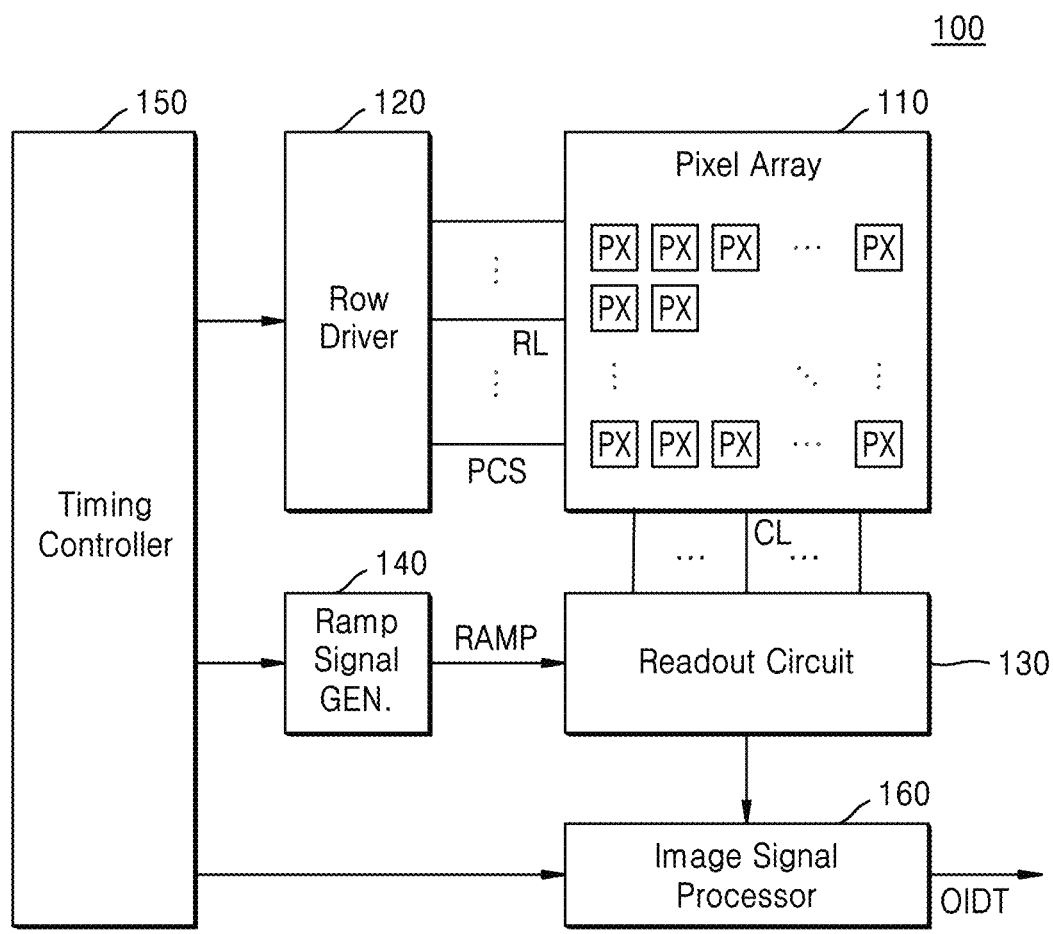
FIG. 1 is a block diagram illustrating an image sensor according to an embodiment.

Hereinafter, embodiments are described in detail with reference to the accompanying drawings. The same reference numerals may be used for the same components in the drawings, and duplicate descriptions thereof may be omitted.

FIG. 1 is a block diagram illustrating an image sensor 100 according to an embodiment.

The image sensor 100 may be mounted in electronic devices having an image or light sensing function. For example, the image sensor 100 may be mounted in electronic devices, such as a camera, a smartphone, a wearable device, an Internet of Things (IoT) device, a home appliance, a tablet personal computer (PC), a personal digital assistant (PDA), a portable multimedia player (PMP), a navigation device, a drone, or an advanced driver assistance system (ADAS). In addition, the image sensor 100 may be mounted in electronic devices included as components in vehicles, furniture, manufacturing equipment, doors, various kinds of measurement devices, or the like.

Referring to FIG. 1, the image sensor 100 may include, for example, a pixel array 110, a row driver 120, a readout circuit 130, a ramp signal generator 140, a timing controller 150, and an image signal processor 160.

Figure 5:
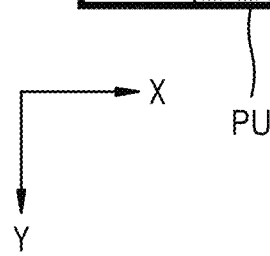
FIG. 5 illustrates a pixel array having a Bayer pattern, according to an embodiment.

The pixel array 110 may include a plurality of pixels PX arranged in a matrix. The pixel array 110 may further include a plurality of row lines RL and a plurality of column lines CL connected to the plurality of pixels PX. Each of the plurality of pixels PX may include at least one photoelectric conversion device (or photosensitive device). A photoelectric conversion device may sense light and convert the sensed light into photocharges. For example, the photoelectric conversion device may be a photosensitive device including an organic material or an inorganic material, such as an inorganic photodiode, an organic photodiode, a perovskite photodiode, a phototransistor, a photogate, or a pinned photodiode. In an embodiment, each of the plurality of pixels PX may include a plurality of photoelectric conversion devices. In an embodiment, the pixel array 110 may have a Bayer pattern. An example of a Bayer pattern is shown in FIG. 5.

Each of the plurality of pixels PX may sense light of a particular spectral region from received light. For example, the pixel array 110 may include a red pixel configured to convert light in a red spectral region into an electrical signal, a green pixel configured to convert light in a green spectral region into an electrical signal, and a blue pixel configured to convert light in a blue spectral region into an electrical signal. The pixel array 110 is not limited thereto and may include, in addition to red, green, and blue pixels, a pixel, such as a white pixel or a yellow pixel, configured to convert light in another spectral region into an electrical signal.

The row driver 120 may generate a plurality of control signals PCS. The plurality of control signals PCS may control an operation of pixels PX in respective rows. The plurality of control signals PCS may be generated under control of the timing controller 150. The row driver 120 may provide the plurality of control signals PCS to the plurality of pixels PX of the pixel array 110 via the plurality of row lines RL. In response to the plurality of control signals PCS provided from the row driver 120, the pixel array 110 may be driven in a unit of at least one row. Under control by the row driver 120, the pixel array 110 may output a plurality of pixel signals via respective ones of the plurality of column lines CL. According to the inventive concept, the row driver 120 may simultaneously provide the control signal PCS to n rows, and data of the n rows may be read out simultaneously. Herein, n may be an integer greater than 1.

The row driver 120 may provide the control signal PCS to a row unit. In this case, the row driver 120 may provide the control signal PCS to pixels PX positioned in even or odd columns of a row. For example, the row driver 120 may provide the control signal PCS to pixels PX positioned in even columns of a first row of the n rows and may not provide the control signals PCS to pixels positioned in odd columns of the first row. In response to the plurality of control signals PCS provided by the row driver 120, pixel signals may be output from pixels PX and read out. Therefore, in the specification, providing the control signal PCS by the row driver 120 may indicate reading out a pixel signal output from a corresponding pixel PX, which has received the control signal PCS.

The ramp signal generator 140 may generate a ramp signal RAMP. The ramp signal RAMP ascends or descends with a certain gradient. and the ramp signal generator 140 may provide the ramp signal RAMP to the readout circuit 130.

The readout circuit 130 may include an analog-digital converter circuit (hereinafter, referred to as an ADC circuit) and a line buffer. The ADC circuit may receive a plurality of pixel signals respectively read out from pixels PX in a row selected by the row driver 120 among the plurality of pixels PX. The ADC circuit may convert the plurality of pixel signals into a plurality of pixel values that are digital data.

The ADC circuit may generate and output pixel values in a unit of at least one row by converting a plurality of pixel signals received from the pixel array 110 via the plurality of column lines CL into digital data based on the ramp signal RAMP from the ramp signal generator 140.

The readout circuit 130 may include a plurality of ADC circuits respectively corresponding to the plurality of column lines CL. Each of the plurality of ADC circuits may compare the ramp signal RAMP to a pixel signal received via a corresponding column line CL and generate a pixel value based on a result of the comparison. For example, the ADC circuit may remove a reset signal from a sensing signal by a correlated double sampling (CDS) scheme and generate a pixel value corresponding to a light intensity sensed from a pixel PX.

The line buffer may include a plurality of line memories. The line buffer may store, in a unit of certain rows, a plurality of pixel values output from the ADC circuit. For example, the line buffer may store a plurality of pixel values corresponding one or more rows according to an operating mode of the image sensor 100.

The timing controller 150 may control timings of other components of the image sensor 100. For example, the timing controller 150 may control timings of one or more of the row driver 120, the readout circuit 130, the ramp signal generator 140, or the image signal processor 160.

The image signal processor 160 may receive pixel values from the readout circuit 130, generate image data by arranging the received pixel values, and perform image processing operations, such as image quality compensation, binning, and downsizing, on the generated image data. Accordingly, image-processed output image data OIDT may be generated and output.

The output image data OIDT may be output to an external processor. For example, the output image data OIDT may be output to an application processor. The application processor may store, image-process, or display the output image data OIDT.

Figure 2:
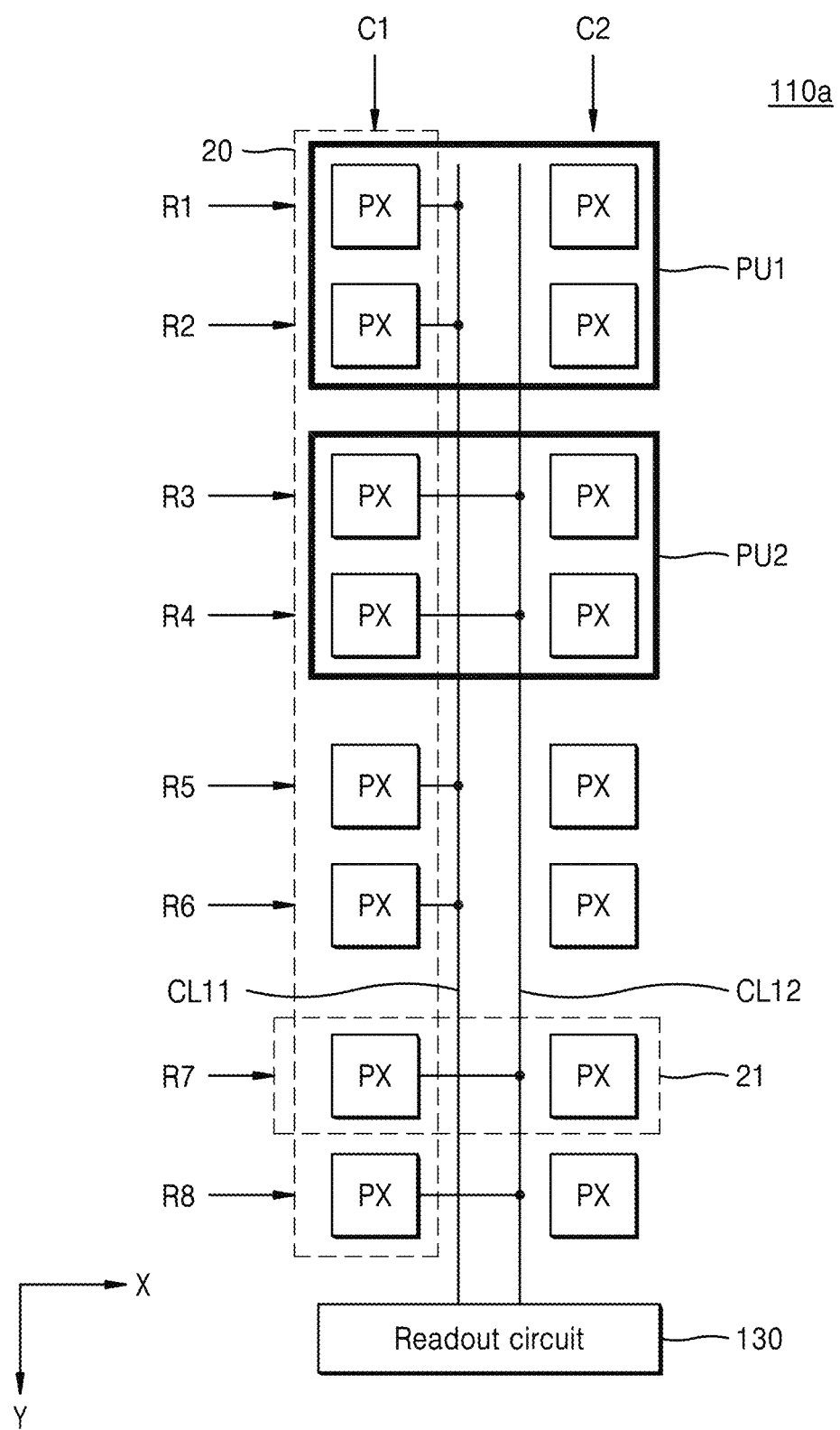
FIG. 2 illustrates a portion of a pixel array according to an embodiment.

FIG. 2 illustrates a portion of a pixel array 110*a* according to an embodiment.

Referring to FIG. 2, the pixel array 110*a* may include a plurality of pixels PX arranged along horizontal lines and vertical lines. The horizontal lines may include a first horizontal line R1, second horizontal line R2, third horizontal line R3, fourth horizontal line R4, fifth horizontal line R5, sixth horizontal line R6, seventh horizontal line R7, and eighth horizontal line R8. The vertical lines may include a first vertical line C1 and a second vertical line C2. Herein, the horizontal lines may extend in a first direction (X direction) and the vertical lines may extend in a second direction (Y direction) perpendicular to the first direction. Pixels arranged in the first direction may be positioned along a horizontal line, and pixels arranged in the second direction may be positioned along a vertical line. For example, referring to FIG. 2, eight pixels 20 arranged in the second direction may be positioned in the first vertical line C1, and two pixels 21 arranged in the first direction may be positioned in the seventh horizontal line R7. This example is illustrative, and the numbers of pixels positioned (or included) in each horizontal line and each vertical line may vary depending on the numbers of vertical lines and horizontal lines, respectively. Hereinafter, pixels positioned in a horizontal line or a vertical line may be referred to as pixels included in a horizontal line or a vertical line.

Among the eight pixels PX included in the first vertical line C1, the pixels PX positioned in the first horizontal line R1, the second horizontal line R2, the fifth horizontal line R5, and the sixth horizontal line R6 may be connected to a (1-1)st column line CL11, and the pixels PX positioned in the third horizontal line R3, the fourth horizontal line R4, the seventh horizontal line R7, and the eighth horizontal line R8 may be connected to a (1-2)nd column line CL12. Therefore, two pixel signals may be simultaneously read out from pixels PX positioned in two different horizontal lines via the (1-1)st column line CL11 and the (1-2)nd column line CL12. For example, the row driver 120 (see FIG. 1) may simultaneously provide a control signal to the pixel PX positioned in the first horizontal line R1 and the first vertical line C1, and the pixel PX positioned in the third horizontal line R3 and the first vertical line C1, and the pixels PX may output pixel signals via the (1-1)st column line CL11 and the (1-2)nd column line CL12 in response to the control signal.

The row driver 120 (see FIG. 1) according to an embodiment may simultaneously provide the control signal to pixels positioned in n horizontal lines. Herein, n may be an integer greater than 1. The row driver 120 (see FIG. 1) may simultaneously provide the control signal to n horizontal lines and read out n pixel signals from n pixels positioned in the n horizontal lines and one vertical line, and the n pixels may be respectively connected to a plurality of column lines as described herein. In this case, one vertical line of pixels may correspond to n column lines. For example, the first vertical line C1 may correspond to the (1-1)st column line CL11 and the (1-2)nd column line CL12.

Hereinafter, an operation in which the row driver 120 (see FIG. 1) simultaneously provides the control signal to pixels positioned in n horizontal lines (i.e., pixel signals are simultaneously output from the pixels included in the n horizontal lines) may be referred to as a multi-row readout operation.

The readout circuit 130 may include a first ADC circuit connected to the (1-1)st column line CL11 and a second ADC circuit connected to the (1-2)nd column line CL12. For example, when one vertical line corresponds to n column lines, the readout circuit 130 may include n ADC circuits respectively corresponding to the n column lines. That is, each of the n column lines may be connected to one analog-digital converter circuit.

A pixel unit may be a unit including a plurality of pixels PX. For example, a pixel unit may be a unit including four pixels PX arranged as 2×2 matrix. Referring to FIG. 2, a first pixel unit PU1 may include four pixels PX positioned in the first vertical line C1 and the second vertical line C2. The pixels PX of the first pixel unit PU1 may be positioned in the first horizontal line R1 and the second horizontal line R2. A second pixel unit PU2 may include four pixels PX positioned in the first vertical line C1 and the second vertical line C2. The pixels PX of the second pixel unit PU2 may be positioned in the third horizontal line R3 and the fourth horizontal line R4.

The first pixel unit PU1 and the second pixel unit PU2 may be consecutively arranged in the second direction.

Figure 3:
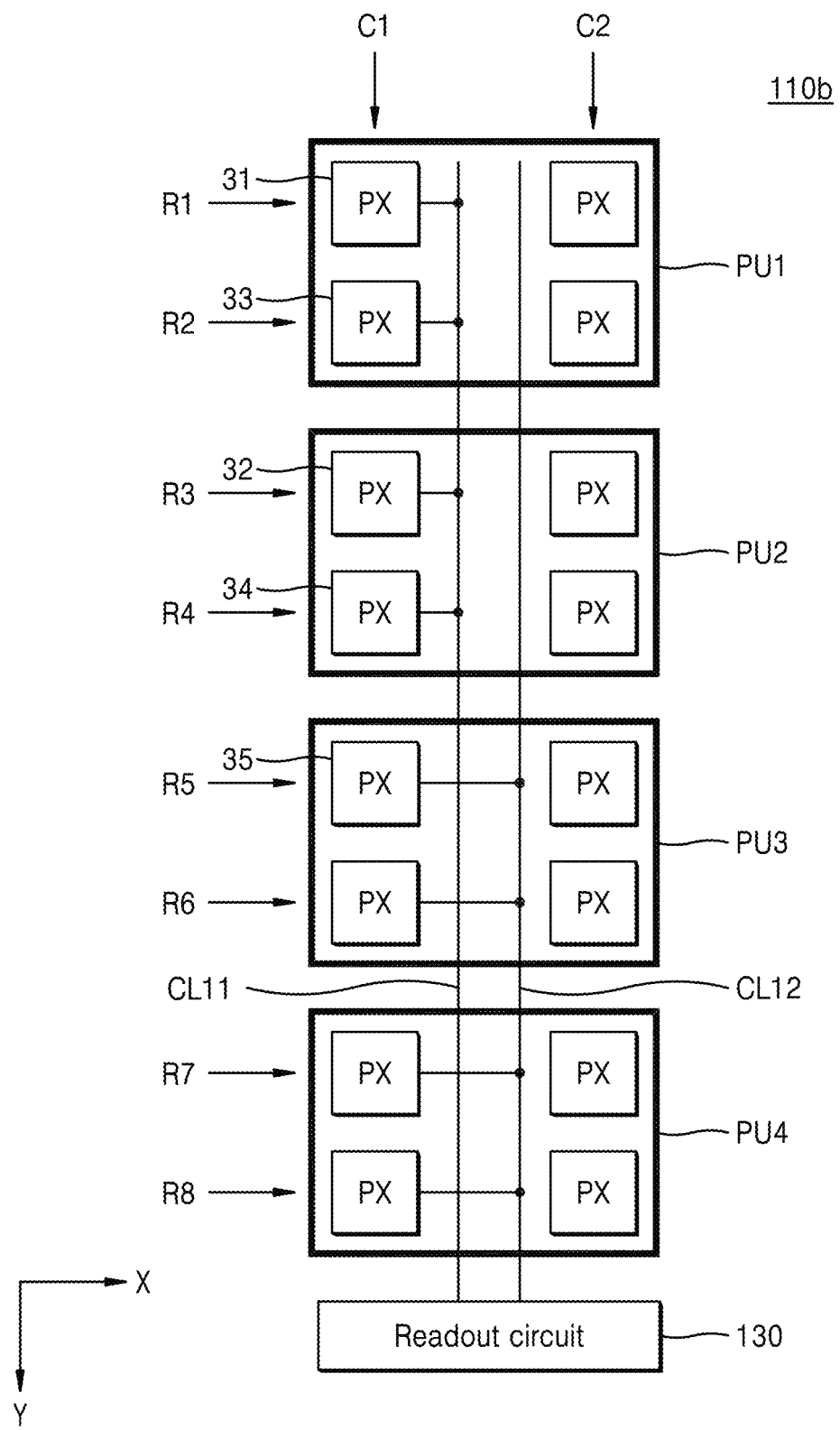
FIG. 3 illustrates a portion of a pixel array according to an embodiment.

FIG. 3 illustrates a portion of a pixel array 110*b* according to an embodiment.

FIG. 3 may be described with reference to components illustrated in FIG. 2, and redundant descriptions thereof may be omitted herein.

Referring to FIG. 3, the pixel array 110*b* may include a plurality of pixels PX arranged along horizontal lines and vertical lines. For example, the pixel array 110*b* may include a plurality of pixels PX arranged along eight horizontal lines, e.g., the first to eighth horizontal lines R1 to R8, and two vertical lines, e.g., the first vertical line C1 and the second vertical line C2. A third pixel unit PU3 may include four pixels PX positioned in the first vertical line C1 and the second vertical line C2. The pixels PX of the third pixel unit PU3 may be positioned in the fifth horizontal line R5 and the sixth horizontal line R6. A fourth pixel unit PU4 may include four pixels PX positioned in the first vertical line C1 and the second vertical line C2. The pixels PX of the fourth pixel unit PU4 may be positioned in the seventh horizontal line R7 and the eighth horizontal line R8.

The first pixel unit PU1, the second pixel unit PU2, the third pixel unit PU3, and the fourth pixel unit PU4 may be consecutively arranged in the second direction.

The pixels PX positioned in the first vertical line C1 among the pixels PX included in each of the first pixel unit PU1 and the second pixel unit PU2 may be connected to the (1-1)st column line CL11. The pixels PX positioned in the first vertical line C1 among the pixels PX included in each of the third pixel unit PU3 and the fourth pixel unit PU4 may be connected to the (1-2)nd column line CL12. In other words, four pixels PX positioned in the same vertical line may be connected to one column line.

An image sensor including the pixel array 110b may operate in a two-binning mode (m=2). Herein, m denotes the number of pixel units including pixels PX connected to the same column line among pixels PX arranged in the second direction. A binning mode may be a mode in which pixels connected to one column line and arranged in the second direction simultaneously output pixel signals via the column line. For example, when the image sensor including the pixel array 110b operates in the binning mode, a pixel 31 and a pixel 32 connected to the (1-1)st column line CL11 among the pixels PX included in the first pixel unit PU1 and the second pixel unit PU2 arranged in the second direction may simultaneously output pixel signals via the (1-1)st column line CL11.

When the image sensor including the pixel array 110b does not operate in the binning mode and operates in a normal mode, the pixel 31 and the pixel 32 share the (1-1)st column line CL11 and do not simultaneously output the pixel signals. When the pixel array 110b operates in the normal mode, the row driver 120 (see FIG. 1) may simultaneously provide a control signal to the pixel 31 and a pixel 35. The pixel 31 may output a pixel signal via the (1-1)st column line CL11, and the pixel 35 may output a pixel signal via the (1-2)nd column line CL12.

According to the inventive concept, when m pixels at the same positions in m pixel units among pixels included in the m pixel units adjacent to each other in the second direction share the same column line, a pixel array including the m pixels is referred to as an m-binning pixel array. For example, referring to FIG. 3, the pixel 31 and the pixel 32 respectively included in the first pixel unit PU1 and the second pixel unit PU2 arranged in the second direction may be referred to as pixels PX at the same positions (or corresponding positions) in pixel units. Likewise, a pixel 33 and a pixel 34 may be referred to as pixels PX at the same positions in pixel units. In a two-binning pixel array (m=2) such as the pixel array 110b, two pixels at the same positions may be connected to a same column line. For example, in the two-binning pixel array (m=2) of the pixel array 110b, the pixel 31 and the pixel 32 may be disposed at the same positions and are connected to the (1-1)st column line CL11.

Compared to the pixel array 110a of FIG. 2, the pixel array 110b may have a wider row interval between horizontal lines through which a readout may be performed during a multi-row readout operation according to the inventive concept. For example, referring to FIG. 2, the pixel array 110a of FIG. 2 may simultaneously read out the pixels PX positioned in the first horizontal line R1 and the third horizontal line R3, but when the pixel array 110b of FIG. 3 operates in the normal mode, the pixels PX positioned in the first horizontal line R1 and the third horizontal line R3 may not be simultaneously read out, and the pixels PX positioned in the first horizontal line R1 and the fifth horizontal line R5 may be simultaneously read out, and thus, a row interval is wider in the pixel array 110b than in the pixel array 110a. Here, the row interval may be an interval spaced apart in the second direction Y between horizontal lines.

Figure 4:
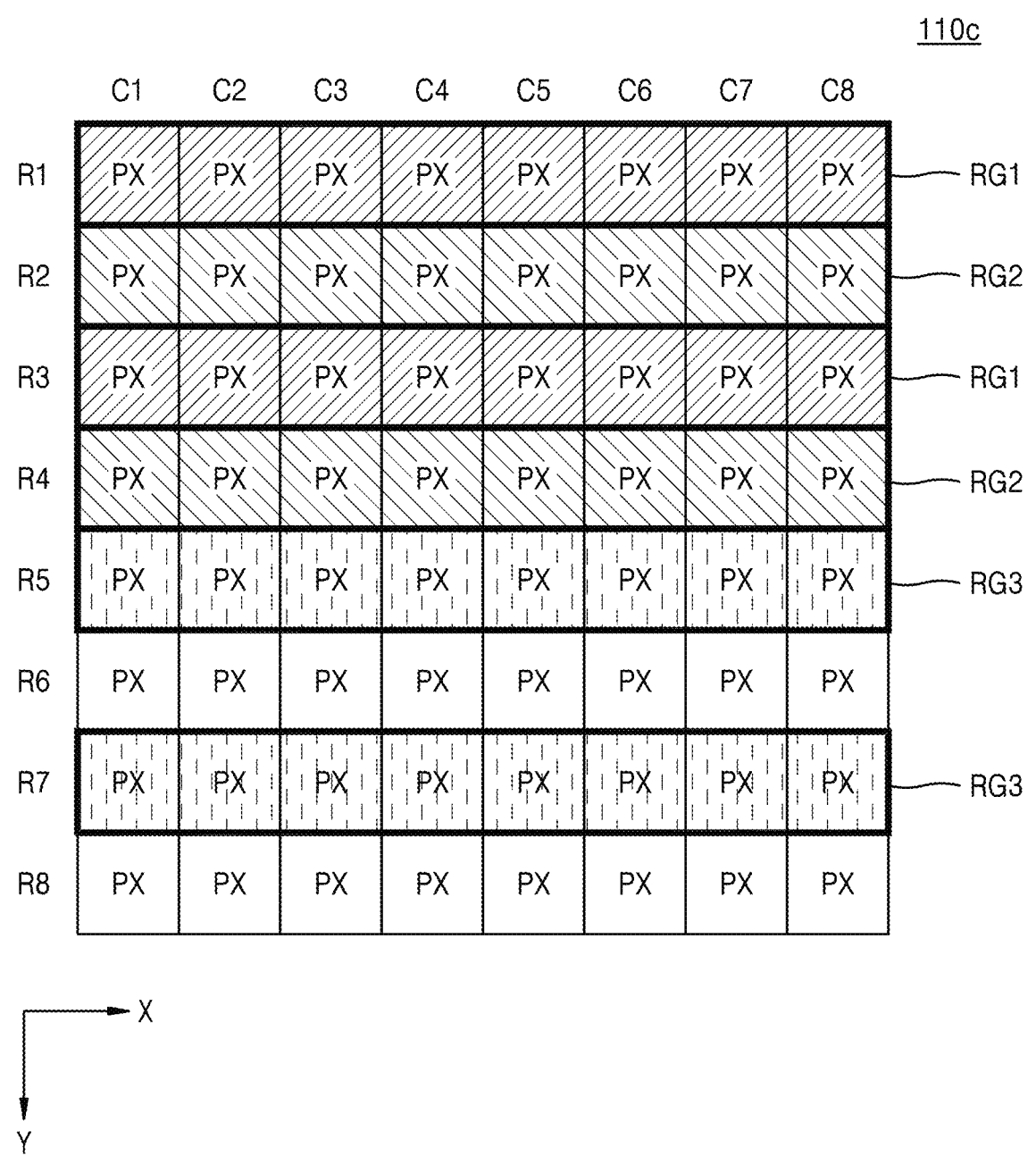

FIG. 4 illustrates a pixel array 110c according to an embodiment.

FIG. 4 shows the pixel array 110c including pixels PX arranged along horizontal lines and vertical lines. For example, the pixel array 110c may include pixels PX arranged along eight horizontal lines, e.g., the first to eighth horizontal lines R1 to R8, and eight vertical lines, e.g., first vertical line C1, second vertical line C2, third vertical line C3, fourth vertical line C4, fifth vertical line C5, sixth vertical line C6, seventh vertical line C7, and eighth vertical line C8. The pixel array 110c may include a first horizontal group RG1, a second horizontal group RG2, and a third horizontal group RG3.

The term "horizontal group" is a conceptual term used for convenience of description in the inventive concept. A horizontal group may include two or more horizontal lines. When a number of horizontal lines in the horizontal group changes or when the horizontal lines making up the horizontal group changes, the horizontal group may be referred to as a different horizontal group.

Referring to FIG. 4, the first horizontal group RG1 may include the first and third horizontal lines R1 and R3, which are two consecutive odd horizontal lines, the second horizontal group RG2 may include the second and fourth horizontal lines R2 and R4, which are two consecutive even horizontal lines, and the third horizontal group RG3 may include the fifth and seventh horizontal lines R5 and R7, which are two consecutive odd horizontal lines.

An order of horizontal lines included in each horizontal group may be determined in the second direction. For example, among the two horizontal lines included in the first horizontal group RG1, the first horizontal line R1 may be referred to as a first horizontal line and the third horizontal line R3 may be referred to as a last horizontal line. For example, an odd horizontal line next to the last horizontal line in the first horizontal group RG1 may be the first horizontal line in the third horizontal group RG3.

When the row driver 120 (see FIG. 1) according to the inventive concept simultaneously provides a control signal to pixels positioned in n horizontal lines, the n horizontal lines may belong to one horizontal group.

FIG. 5 illustrates a pixel array 110d having a Bayer pattern, according to an embodiment.

Referring to FIG. 5, in the pixel array 110d having a Bayer pattern, a red pixel R and a green pixel, e.g., a first green pixel Gr, may be repeatedly arranged in a horizontal line and another green pixel, e.g., a second green pixel Gb, and a blue pixel B, are repeatedly arranged in a next horizontal line, and the green pixels, e.g., the first green pixel Gr and the second green pixel Gb, may be positioned in a diagonal line. Because the green pixels, e.g., the first green pixels Gr and the second green pixels Gb, are closely associated with brightness, the green pixels may be arranged in all the rows, and the red pixels R and the blue pixels B may be disposed in alternating horizontal lines. The first green pixel Gr and the second green pixel Gb may be pixels associated with brightness. The greater the average difference between time points at which a control signal is provided to the first green pixel Gr and the second green pixel Gb included in each of a plurality of pixel units arranged in a column direction, the more noise may be in an image generated by an image sensor. This is described herein with reference to FIGS. 7A to 15B.

Hereinafter, the pixel array 110d according to an embodiment may have a Bayer pattern. However, the technical idea of the inventive concept is not limited thereto. For example, the technical idea of the inventive concept may be applied to pixel arrays having various patterns including a structure in which pixels of three different colors are repeatedly arranged, and pixels associated with brightness are arranged in every row and positioned in a diagonal line in adjacent rows. For example, the technical idea of the inventive concept may be applied to an RGBW pattern including the first green pixel Gr, the second green pixel Gb, the red pixel R, the blue pixel B, and a white pixel, or an RGBY pattern including the first green pixel Gr, the second green pixel Gb, the red pixel R, the blue pixel B, and a yellow pixel.

A pixel unit PU may include the first green pixel Gr, the second green pixel Gb, the red pixel R, and the blue pixel B arranged in a 2×2 form. Hereinafter, for convenience of description, one pixel unit PU may have one Bayer pattern. However, the inventive concept is not limited thereto.

The first green pixel Gr, the second green pixel Gb, the red pixel R, and the blue pixel B included in the pixel unit PU emit respective light, and a control signal may be provided to the first green pixel Gr, the second green pixel Gb, the red pixel R, and the blue pixel B at different time points, respectively. A color emitted from pixels included in odd vertical lines of each horizontal line differs from a color emitted from pixels included in even vertical lines of a corresponding horizontal line, and although pixels are included in the same horizontal line, a time point at which the control signal may be provided to pixels included in the odd vertical lines may differ from a time point at which the control signal may be provided to pixels included in the even vertical lines. In addition, in the case that colors emitted from pixels included in adjacent odd and even horizontal lines are different from each other, the control signal may not be simultaneously provided to consecutive horizontal lines. In this case, the control signal may be simultaneously provided to a plurality of even horizontal lines or a plurality of odd horizontal lines. As a result, respective time points at which the control signal may be provided to pixels arranged in a Bayer pattern may be different from each other. For example, the control signal may be provided to four pixels of a Bayer pattern at different respective time points.

Figure 6:
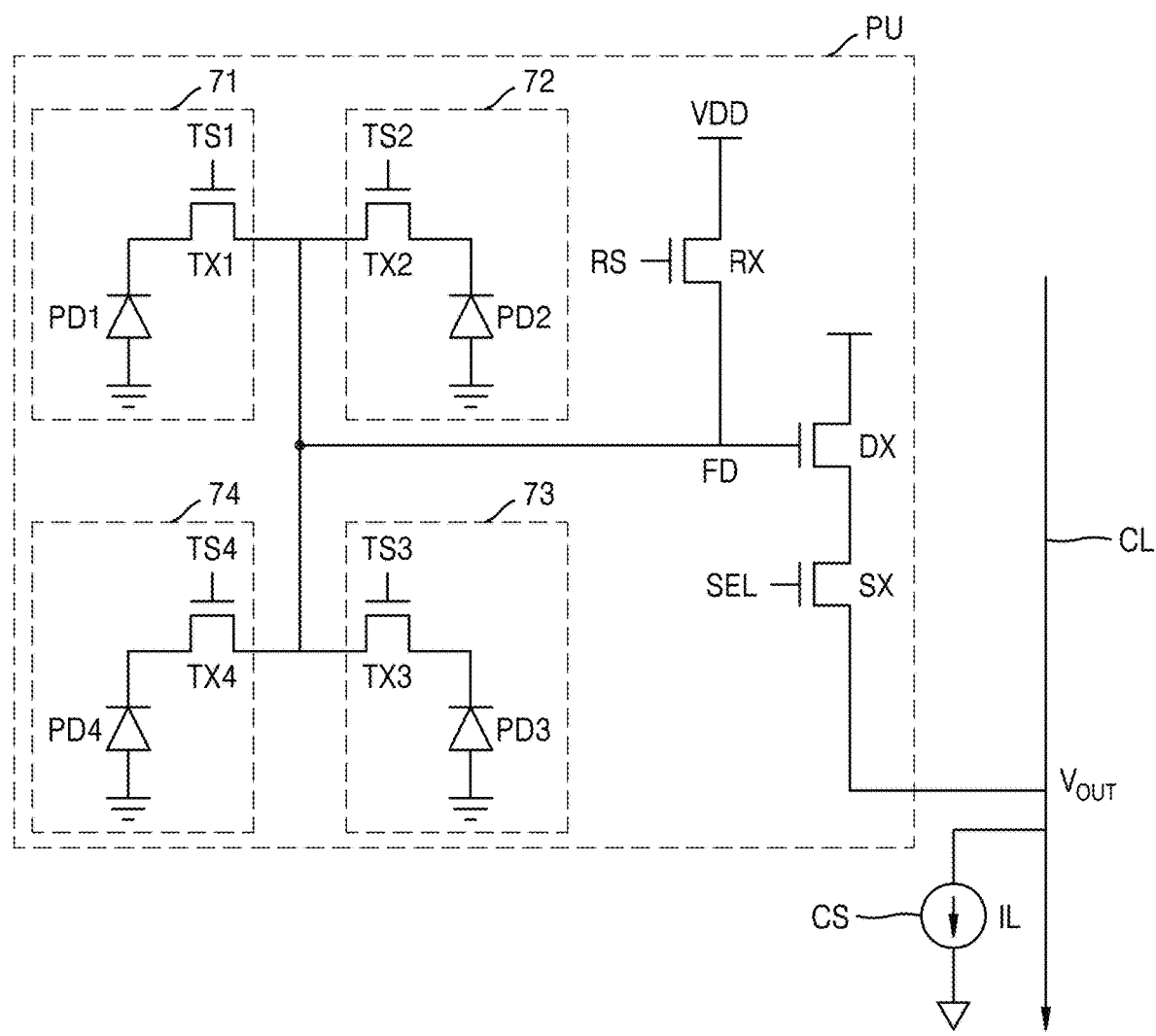
FIG. 6 is a circuit diagram illustrating a structure in which a plurality of pixels share a floating diffusion node, according to an embodiment.

FIG. 6 is a circuit diagram illustrating a structure in which a plurality of pixels share a floating diffusion node, according to an embodiment.

Referring to FIG. 6, a pixel unit PU may include a first pixel circuit 71, a second pixel circuit 72, a third pixel circuit 73, and a fourth pixel circuit 74. The pixel unit PU may further include a reset transistor RX, a drive transistor DX, and a select transistor SX.

The first pixel circuit 71 may include a first photodiode PD1 and a first transfer transistor TX1, the second pixel circuit 72 may include a second photodiode PD2 and a second transfer transistor TX2, the third pixel circuit 73 may include a third photodiode PD3 and a third transfer transistor TX3, and the fourth pixel circuit 74 may include a fourth photodiode PD4 and a fourth transfer transistor TX4.

The first transfer transistor TX1, the second transfer transistor TX2, the third transfer transistor TX3, the fourth transfer transistor TX4, the reset transistor RX, the drive transistor DX, and the select transistor SX may operate in response to control signals. These control signals may include a first transfer control signal TS1, a second transfer control signal TS2, a third transfer control signal TS3, a fourth transfer control signal TS4, a reset control signal RS, and a select control signal SEL. The control signals may be provided from the row driver 120 (see FIG. 1).

The reset transistor RX may be turned on in response to the reset control signal RS applied to a gate terminal thereof to connect a pixel power source voltage VDD to a floating diffusion node FD, and reset, by the pixel power source voltage VDD, photocharges accumulated in the floating diffusion node FD.

The first transfer transistor TX1, the second transfer transistor TX2, the third transfer transistor TX3, and the fourth transfer transistor TX4 may be respectively turned on in response to the first transfer control signal TS1, the second transfer control signal TS2, the third transfer control signal TS3, and the fourth transfer control signal TS4 to respectively transfer charges generated by the first photodiode PD1, the second photodiode PD2, the third photodiode PD3, and the fourth photodiode PD4 to the floating diffusion node FD.

The charges accumulated in the floating diffusion node FD may generate a voltage. In other words, the charges accumulated in the floating diffusion node FD may be converted into a voltage. The voltage of the floating diffusion node FD may be output as a pixel voltage Vout via the select transistor SX. For example, the pixel voltage may vary with the accumulated charges output by the floating diffusion node FD.

The select transistor SX may be turned on in response to the select control signal SEL applied to a gate terminal thereof. The select transistor SX may be turned on in response to the select control signal SEL to output the pixel voltage Vout (or current) output from the drive transistor DX to a column line CL. The pixel voltage Vout may be provided to the readout circuit 130 (see FIG. 1) via the column line CL.

The drive transistor DX may operate as a source follower based on a bias current IL generated by a current source CS connected to the column line CL.

Referring to FIG. 6 and FIG. 5, the pixel unit PU of FIG. 5 may correspond to the pixel unit PU of FIG. 6. For example, the first pixel circuit 71 may correspond to the first green pixel Gr, the second pixel circuit 72 may correspond to the red pixel R, the third pixel circuit 73 may correspond to the second green pixel Gb, and the fourth pixel circuit 74 may correspond to the blue pixel B.

Referring to FIG. 6, the first pixel circuit 71, the second pixel circuit 72, the third pixel circuit 73, and the fourth pixel circuit 74 may share a floating diffusion node FD. For example, four pixels of each of the pixel units may share one floating diffusion node. In a case where the pixel circuits share a floating diffusion node FD, respective pixel signals based on photocharges generated by the first photodiode PD1, the second photodiode PD2, the third photodiode PD3, and the fourth photodiode PD4 may not be simultaneously output.

As described herein with reference to FIG. 2, FIG. 3, FIG. 5, and FIG. 6, at least due to the binning mode, the floating diffusion sharing structure, the Bayer pattern, and the like, the row driver 120 (see FIG. 1) may not simultaneously provide the control signal to all or some of the pixels included in one pixel unit PU, and the row driver 120 (see FIG. 1) may provide the control signal to each of the pixels at different points in time.

Figure 7B:
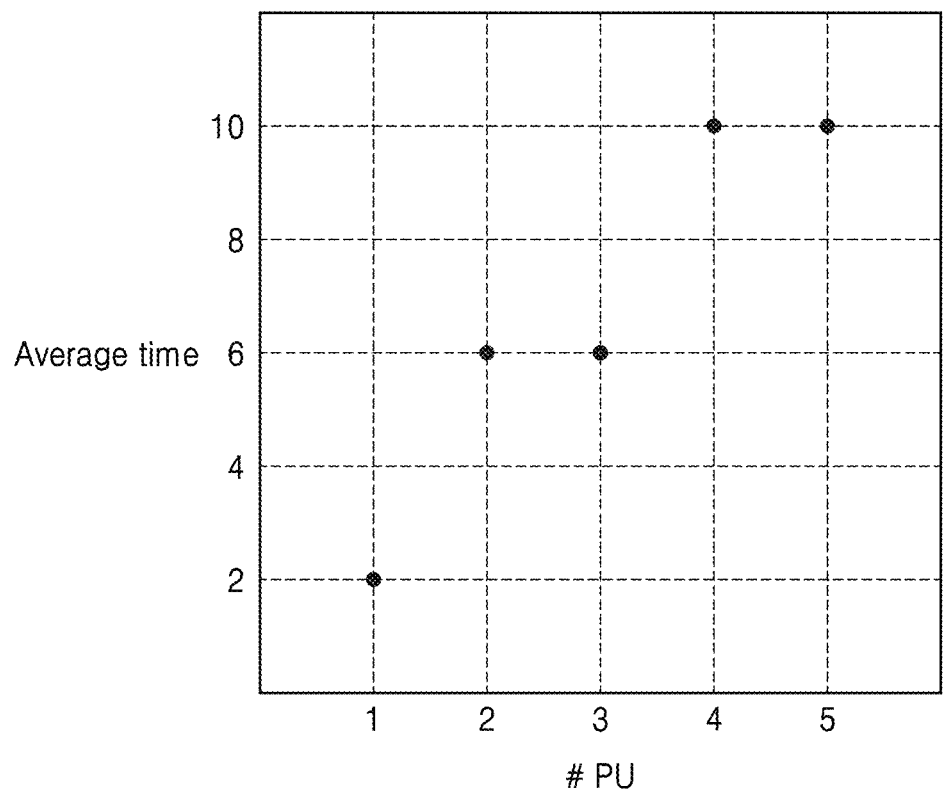
Figure 7C:
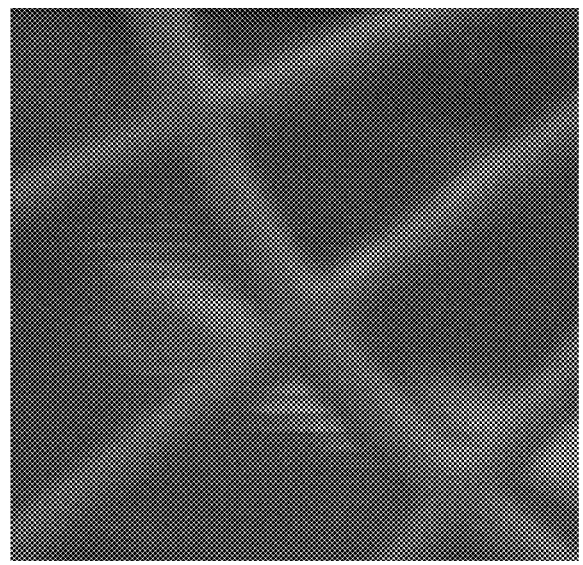

FIG. 7A, FIG. 7B, and FIG. 7C illustrate a readout scheme according to a comparative example.

A pixel array 110e of FIG. 7A may include a plurality of pixels arranged along 13 horizontal lines, e.g., first to thirteenth horizontal lines R1 to R13, and 15 vertical lines, e.g., first and fifteenth vertical lines C1 to C15. In the pixel array 110e of FIG. 7A, one quadrangle formed by one horizontal line intersecting with one vertical line may correspond to one pixel. For example, a first pixel unit PU1 may include four quadrangles and thus may include four pixels as described herein.

The plurality of pixels included in the pixel array 110e of FIG. 7A may be arranged in the Bayer pattern of FIG. 5. For example, each of the first pixel unit PU1, a second pixel unit PU2, a third pixel unit PU3, a fourth pixel unit PU4, and a fifth pixel unit PU5 may be a pixel unit PU having the Bayer pattern of FIG. 5.

In a description herein, the labels t1 to t4 presented in quadrangles indicate time points at which a row driver provides a control signal to the corresponding pixels. For example, referring to FIG. 7A, the row driver may provide the control signal to pixels positioned in odd vertical lines C1, C3, C5, C7, C9, C11, C13, and C15 in the first horizontal line R1 and the third horizontal line R3 at a first time point t1 and provide the control signal to pixels positioned in the odd vertical lines C1, C3, C5, C7, C9, C11, C13, and C15 in the second horizontal line R2 and the fourth horizontal line R4 at a fourth time point t4.

Referring to FIG. 7A, similar to FIG. 4, a first horizontal group RG1 may include two (n=2) consecutive odd horizontal lines, including the first horizontal line R1 and the third horizontal line R3, and a second horizontal group RG2 may include two (n=2) consecutive even horizontal lines, including the second horizontal line R2 and the fourth horizontal line R4. At a second time point t2, the control signal may be provided to pixels positioned in even vertical lines C2, C4, C6, C8, C10, C12, and C14 in the first horizontal line R1 and the third horizontal line R3 included in the first horizontal group RG1. At a third time point t3, the control signal may be provided to pixels positioned in the even vertical lines C2, C4, C6, C8, C10, C12, and C14 in the second horizontal line R2 and the fourth horizontal line R4 included in the second horizontal group RG2. At the fourth time point t4, the control signal may be provided to the pixels positioned in the odd vertical lines C1, C3, C5, C7, C9, C11, C13, and C15 in the second horizontal line R2 and the fourth horizontal line R4 included in the second horizontal group RG2.

An order in which the control signal may be provided to a plurality of pixels from a fifth time point t5 to a fourteenth time point t14 may be similar to the aforementioned order in which the control signal may be provided from the first time point t1 to the fourth time point t4. For example, similar to the control signal provision order from the first time point t1 to the fourth time point t4, the control signal may be provided to pixels at the same positions in two consecutive pixel units, for example, the second pixel unit PU2 and the third pixel unit PU3, at the same time point.

FIG. 7B is a graph illustrating an average of time points at which the control signal may be provided to each of the first pixel unit PU1, the second pixel unit PU2, the third pixel unit PU3, the fourth pixel unit PU4, and the fifth pixel unit PU5. The horizontal axis indicates different pixel units PU, and the vertical axis indicates an average of the time points at which the control signal may be provided to the different pixel units PU.

The average of the time points at which the control signal may be provided to a pixel unit may indicate an average of the time points at which the control signals are respectively provided to the first green pixel Gr and the second green pixel Gb included in the pixel unit. For example, in a case where each of the first to fifth pixel units PU1 to PU5 of FIG. 7A may have the Bayer pattern of FIG. 5, a time point at which the control signal may be provided to the first green pixel Gr included in the first pixel unit PU1 is the first time point t1, and a time point at which the control signal may be provided to the second green pixel Gb is the third time point t3. Thus, an average of the time points at which the control signal may be provided to the first pixel unit PU1 may be (1+3)/2=2 and an average of the time points at which the control signal is provided to the second pixel unit PU2 may be 6.

Hereinafter, an average of the time points at which the control signal is respectively provided to the first green pixel Gr and the second green pixel Gb included in a pixel unit PU is referred to as an average time. For example, an average time, i.e., a first average time, of the first pixel unit PU1 of FIG. 7A is 2.

Referring to FIG. 7B, the first pixel unit PU1 has the first average time of 2, the second pixel unit PU2 has a second average time of 6, the third pixel unit PU3 has a third average time of 6, the fourth pixel unit PU4 has a fourth average time of 10, and the fifth pixel unit PU5 has a fifth average time of 10. An interval between the average times of the first pixel unit PU1 and the second pixel unit PU2 consecutively arranged in the column direction is 4 (e.g., 6−2=4). An interval between the average times of the third pixel unit PU3 and the fourth pixel unit PU4 consecutively arranged in the column direction is also 4 (e.g., 10−6=4). Therefore, when the control signal is provided to the plurality of pixels included in the pixel array 110e at the control signal provision time points in FIG. 7A, the maximum interval between average times of consecutively arranged pixel units is 4.

In a case where a multi-row readout operation is used, an interval between the average times of pixel units PU consecutively arranged in the second direction may occur, and the interval between the average times of the pixel units PU consecutively arranged in the second direction may vary.

FIG. 7C illustrates an image including noise generated due to the control signal being provisioned to the pixel units PU at different time points as described with reference to FIG. 7A, wherein an interval between the average times of pixel units PU consecutively arranged in the second direction may be relatively large. The greater the interval between the average times of the pixel units consecutively arranged in the second direction, the greater the noise may be in a captured image.

As described herein, the first green pixel Gr and the second green pixel Gb may be associated with the brightness of an image. The pixels associated with brightness may have a larger influence on noise generation than the blue pixel B or the red pixel R. For example, an increase or decrease in light may cause flicker noise in the horizontal direction, as shown in FIG. 7C, when an image is captured. Flicker noise may also be caused by movement of the object being imaged. More particularly, the flicker noise may indicate noise generated in an image of a moving object and/or an increase or decrease in light due to a difference in a time when a control signal is provisioned to different pixel units PU when the image is captured by a rolling shutter scheme. FIG. 8A, FIG. 8B, FIG. 8C, FIG. 8D, FIG. 8E, and FIG. 8F illustrate a readout scheme according to an embodiment.

FIGS. 8A to 8F may be described with reference to components illustrated in FIGS. 7A to 7C, and redundant descriptions thereof may be omitted herein.

FIGS. 8A to 8F illustrate a multi-row readout scheme in which a control signal is simultaneously provided to a plurality of horizontal lines. For example, the control signal may be simultaneously provided to two horizontal lines.

Figure 8A:
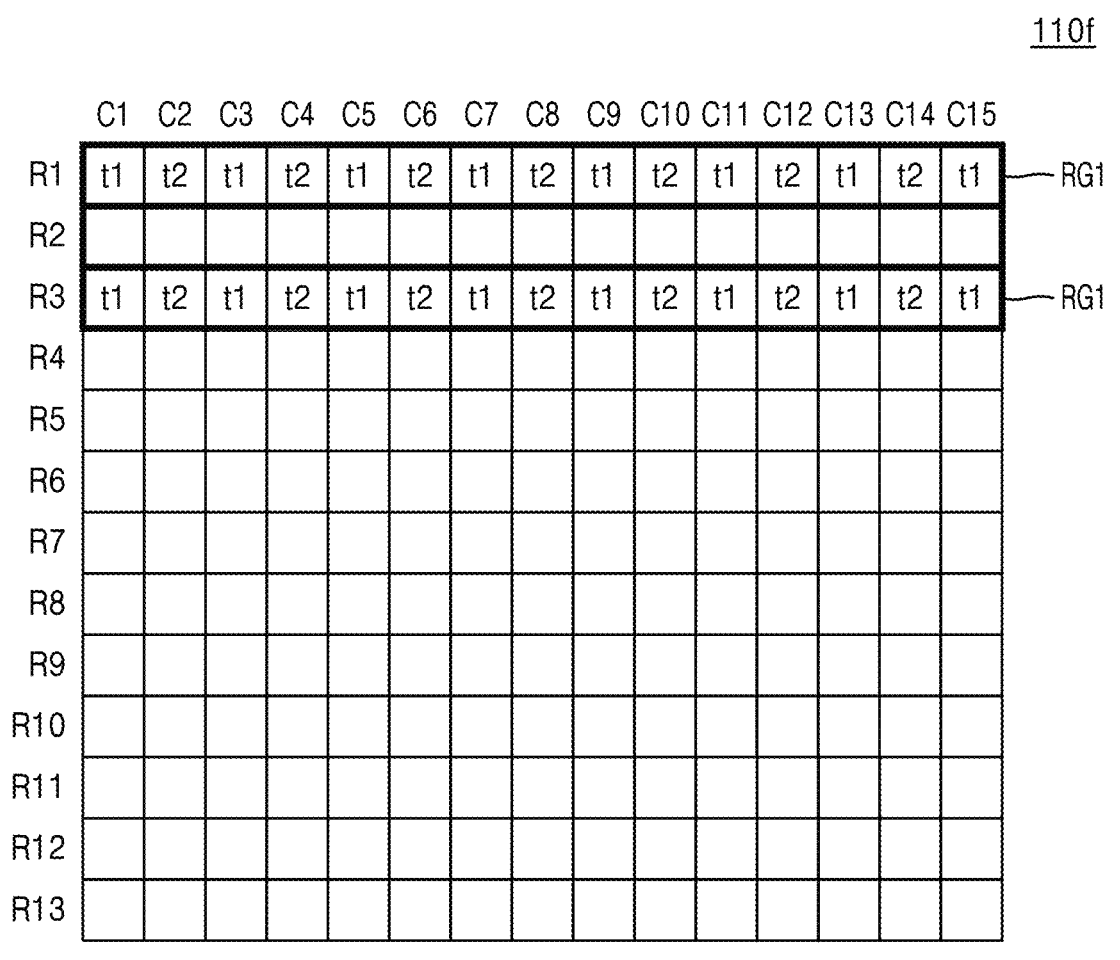

Referring to FIG. 8A, a first horizontal group RG1 may include two (n=2) consecutive odd horizontal lines. For example, the first horizontal group RG1 includes the first horizontal line R1 and the third horizontal line R3, which are consecutive odd horizontal lines. The row driver 120 (see FIG. 1) may provide the control signal to pixels positioned in the odd vertical lines C1, C3, C5, C7, C9, C11, C13, and C15 in the first horizontal group RG1 at the first time point t1 and provide the control signal to pixels positioned in the even vertical lines C2, C4, C6, C8, C10, C12, and C14 in the first horizontal group RG1 at the second time point t2.

It should be understood that time points at which the row driver 120 (see FIG. 1) provides the control signal identify an order in which the control signal may be provided. In a description herein, for convenience of description, although it is described that an order from the first time point t1 to a kth time point tk (k is an integer greater than 1) may indicate an order in which the control signal may be provided to a plurality of pixels included in a pixel array, it shall be understood that the order of time points merely indicates an order among the used time points, and other time points may be present there between. For example, a first time point may indicate a time point prior to a second time point, but one or more time points may be present between the first time point and the second time point. In addition, an interval between time points may indicate a time interval but is not limited thereto. For example, a time interval between the first time point and the second time point may be the same as a time interval between the second time point and a third time point, but the inventive concept is not limited thereto.

Referring to FIG. 8B, the row driver 120 (see FIG. 1) may provide the control signal to pixels positioned in the even vertical lines C2, C4, C6, C8, C10, C12, and C14 in the fourth horizontal line R4 and the sixth horizontal line R6, which are two (n=2) consecutive even horizontal lines included in a second horizontal group RG2 at the third time point t3. The row driver 120 may also provide the control signal to pixels positioned in the odd vertical lines C1, C3, C5, C7, C9, C11, C13, and C15 in the fourth horizontal line R4 and the sixth horizontal line R6 included in the second horizontal group RG2 at the fourth time point t4. As described herein, the first horizontal line of a third horizontal group RG3, i.e., the fifth horizontal line R5, is an odd horizontal line next to the last horizontal line of the first horizontal group RG1, i.e., the third horizontal line R3.

FIG. 8C further illustrates time points from the fifth time point t5 to the fourteenth time point t14 at which the control signal may be provided to a plurality of pixels in an order similar to the control signal provision order from the first time point t1 to the fourth time point t4.

Referring to FIG. 8C, at least one pixel with a different time point at which the control signal may be provided thereto may be present among pixels at the same positions in two pixel units consecutively arranged in the second direction. For example, when each of a first pixel unit PU1 and a second pixel unit PU2 has the Bayer pattern of FIG. 5, the row driver 120 (see FIG. 1) may provide the control signal to a first green pixel included in the first pixel unit PU1 at the first time point t1 and provide the control signal to the first green pixel included in the second pixel unit PU2 at the fifth time point t5.

Referring to FIG. 8A and FIG. 8B, the first horizontal group RG1 includes the first horizontal line R1 and the third horizontal line R3, which are two (n=2) consecutive odd horizontal lines, and the second horizontal group RG2 includes the fourth horizontal line R4 and the sixth horizontal line R6, which are two (n=2) consecutive even horizontal lines. Because the first horizontal line R1 of the first horizontal group RG1 corresponds to the fourth horizontal line R4 of the second horizontal group RG2, and the third horizontal line R3 of the first horizontal group RG1 corresponds to the sixth horizontal line R6 of the second horizontal group RG2, each of the two horizontal lines included in the first horizontal group RG1 may be separated by a three-row interval from a corresponding one of the two horizontal lines included in the second horizontal group RG2. Herein, corresponding horizontal lines may have the same order in horizontal groups including a plurality of horizontal lines. For example, referring to FIG. 8B, the first horizontal line, i.e., the fourth horizontal line R4, of the second horizontal group RG2 and the first horizontal line, i.e., the fifth horizontal line R5, of the third horizontal group RG3 may be corresponding horizontal lines. According to a multi (n)-row readout scheme according to the inventive concept, n consecutive odd horizontal lines included in one horizontal group may respectively correspond to n consecutive even horizontal lines included in another horizontal group, and corresponding horizontal lines may be separated from each other within a range of a three-row interval to a (2*n−1)-row interval, inclusive. For example, referring to FIG. 8A and FIG. 8B, the two consecutive odd horizontal lines R1 and R3 of the first horizontal group RG1 may respectively correspond to the two consecutive even horizontal lines R4 and R6 of the second horizontal group RG2, and the corresponding horizontal lines may be separated by a three-row interval. Similarly, the two consecutive odd horizontal lines R5 and R7 of the third horizontal group RG3 may respectively correspond to the two consecutive even horizontal lines R8 and R10 of the fourth horizontal group (not shown), and the corresponding horizontal lines may be separated by a three-row interval.

In the description of this specification, for convenience of description, a control signal is expressed as being provided to pixels located in continuous odd horizontal lines at the first time point t1 (time of providing the initial control signal). However, the inventive concept is not limited thereto, and a control signal may be provided to pixels located in even horizontal lines continuous at the first time point t1. Furthermore, the expressions 'even' and 'odd' are for the expression of explanation, and the inventive concept in this specification should be understood to include cases where 'even' and 'odd' change each other for embodiments described in this specification.

Referring to FIG. 8C, a pixel array 110*f* may include two dummy row lines. That is, the pixel array 110*f* may include two dummy horizontal lines. More particularly, in FIG. 8B, the control signal may not be provided to the second horizontal line R2. For example, the second horizontal line R2 may be a dummy row line. A dummy row line may indicate a horizontal line including a pixel to which the control signal is not provided. In addition, a dummy row line may indicate a horizontal line including a pixel to which the control signals were provided, but due to an adjacent dummy row line, the horizontal line may not be reflected in an image, such as the first horizontal line R1. More particularly, control signals are provided to all pixels included in the first horizontal line R1, but the second horizontal line R2 is a dummy row line, and so the image corresponding to the first horizontal line R1 may not be reflected in the image. This may prevent noise from the second horizontal line R2 from being reflected in the generated image in a case where data of the first horizontal line R1 appears in the image.

In an embodiment, the number of dummy row lines included in a pixel array may vary depending on the number (i.e., n) of horizontal lines simultaneously receiving the control signal, the aforementioned row interval between corresponding horizontal lines included in different horizontal groups, and/or a control signal provision order. A pixel array may include between 2 and 2*n−1 dummy row lines, inclusive. Herein, n indicates the number of horizontal lines having pixels simultaneously receiving the control signal. Herein, n is an integer greater than 1.

Figure 8D:
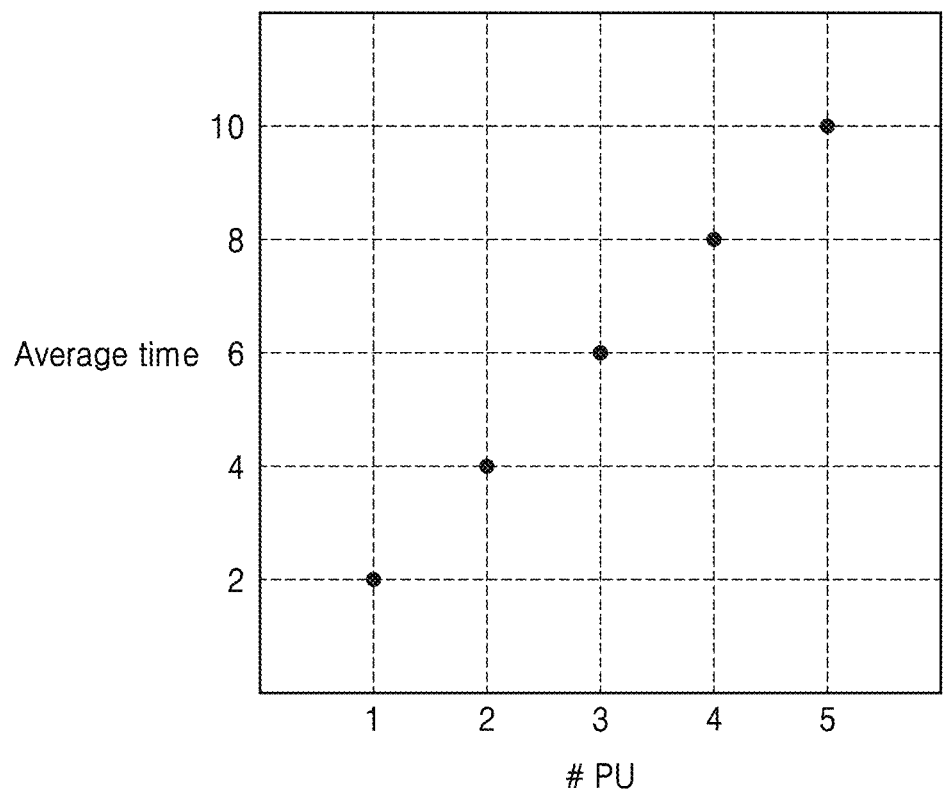

Referring to FIGS. 8C and 8D, an average time of the first pixel unit PU1 is 2, an average time of the second pixel unit PU2 is 4, an average time of a third pixel unit PU3 is 6, an average time of a fourth pixel unit PU4 is 8, and an average time of a fifth pixel unit PU5 is 10. An interval between the average times of each of the first pixel unit PU1, the second pixel unit PU2, the third pixel unit PU3, the fourth pixel unit PU4, and the fifth pixel unit PU5 consecutively arranged in the column direction and a neighboring pixel unit PU is not greater than 2.

Therefore, the row driver 120 (see FIG. 1) may provide the control signal to at least one pixel among pixels at the same positions in n pixel units consecutively arranged in the second direction at a time point different from those for the other pixels, thereby reducing the maximum interval between the average times of the pixel units consecutively arranged in the second direction more than the case of FIGS. 7A and 7B. For example, referring to FIG. 8C, the row driver 120 (see FIG. 1) may provide the control signal to pixels at the same positions in the first pixel unit PU1 and the second pixel unit PU2 consecutively arranged in the second direction, e.g., a pixel positioned in the third horizontal line R3 and the first vertical line C1 and a pixel positioned in the fifth horizontal line R5 and the first vertical line C1, at different time points, i.e., the first time point t1 and the fifth time point t5, respectively. Therefore, referring to FIG. 8F, an interval between the average times of the pixel units PU consecutively arranged in the column direction may be reduced by a control signal provision method according to the inventive concept, thereby alleviating or preventing a flicker noise. The control signal provision method (or a pixel signal readout scheme) described with reference to FIG. 8A, FIG. 8B, and FIG. 8C may be referred to as a sliding readout scheme.

Referring to FIGS. 8A to 8C, a time interval between the first time point t1 at which the row driver 120 (see FIG. 1) provides the control signal to pixels positioned in the odd vertical lines C1, C3, C5, C7, C9, C11, C13, and C15 in two (n=2) consecutive odd horizontal lines, i.e., the first and third horizontal lines R1 and R3, included in the first horizontal group RG1 and the third time point t3 at which the row driver 120 (see FIG. 1) provides the control signal to pixels positioned in the even vertical lines C2, C4, C6, C8, C10, C12, and C14 in two (n=2) consecutive even horizontal lines, i.e., the fourth and sixth horizontal lines R4 and R6, included in the second horizontal group RG2 may be 2. Further, a time interval between the third time point t3 at which the row driver 120 (see FIG. 1) provides the control signal to the pixels positioned in the even vertical lines C2, C4, C6, C8, C10, C12, and C14 in the two (n=2) consecutive even horizontal lines, i.e., the fourth and sixth horizontal lines R4 and R6, included in the second horizontal group RG2 and the fifth time point t5 at which the row driver 120 (see FIG. 1) provides the control signal to pixels positioned in the odd vertical lines C1, C3, C5, C7, C9, C11, C13, and C15 in two (n=2) consecutive odd horizontal lines, i.e., the fifth and seventh horizontal lines R5 and R7, included in the third horizontal group RG3 may be 2 as well.

FIG. 9A, FIG. 9B, FIG. 9C, FIG. 9D, and FIG. 9E illustrate a readout scheme according to an embodiment.

FIGS. 9A to 9E may be described with reference to components illustrated in FIGS. 8A to 8D, and redundant descriptions thereof may be omitted herein.

Figure 9E:
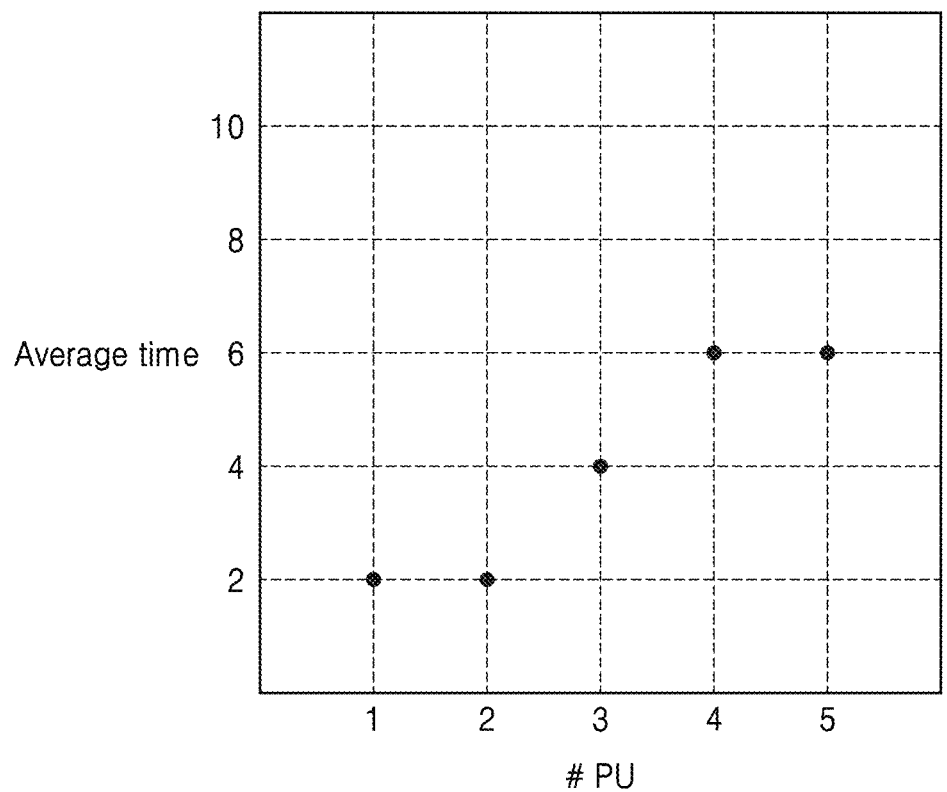

Referring to FIG. 9A, the row driver 120 (see FIG. 1) may simultaneously provide a control signal to pixels positioned in three (n=3) horizontal lines. That is, referring to FIGS. 9A to 9E, unlike the description made with reference to FIGS. 8A to 8D, simultaneous readout of an odd number of horizontal lines by the sliding readout scheme is described.

Referring to FIG. 9A, the row driver 120 (see FIG. 1) may provide the control signal to pixels positioned in the odd vertical lines C1, C3, C5, C7, C9, C11, C13, and C15 in a first horizontal group RG1 including three consecutive odd horizontal lines, i.e., the first, third, and fifth horizontal lines R1, R3, and R5, at the first time point t1.

Referring to FIG. 9B, the row driver 120 (see FIG. 1) may provide the control signal to pixels positioned in the even vertical lines C2, C4, C6, C8, C10, C12, and C14 in a second horizontal group RG2 including three consecutive odd horizontal lines, i.e., the third, fifth, and seventh horizontal lines R3, R5, and R7, at the second time point t2.

Referring to FIG. 9C, the row driver 120 (see FIG. 1) may provide the control signal to pixels positioned in the even vertical lines C2, C4, C6, C8, C10, C12, and C14 in a third horizontal group RG3 including three consecutive even horizontal lines, i.e., the fourth, sixth, and eighth horizontal lines R4, R6, and R8, at the third time point t3 and provide the control signal to pixels positioned in the odd vertical lines C1, C3, C5, C7, C9, C11, C13, and C15 in the third horizontal group RG3 including the three consecutive even horizontal lines, i.e., the fourth, sixth, and eighth horizontal lines R4, R6, and R8, at the fourth time point t4.

FIG. 9D further illustrates time points from the fifth time point t5 to the ninth time point t9 at which the control signal may be provided to a plurality of pixels included in a pixel array 110g in an order similar to the control signal provision order from the first time point t1 to the fourth time point t4.

Referring to FIGS. 9A to 9C, the first horizontal group RG1 includes three (n=3) consecutive odd horizontal lines, i.e., the first, third, and fifth horizontal lines R1, R3, and R5, and the third horizontal group RG3 includes three (n=3) consecutive odd horizontal lines, i.e., the fourth, sixth, and eighth horizontal lines R4, R6, and R8. Each of the three horizontal lines included in the first horizontal group RG1 may be separated by a three-row interval from a corresponding one of the three horizontal lines included in the third horizontal group RG3.

Referring to FIG. 9D, the pixel array 110g may include two dummy row lines, i.e., the first and second horizontal lines R1 and R2. That is, the pixel array 110g may include two dummy horizontal lines.

Referring to FIGS. 9D and 9E, the row driver 120 (see FIG. 1) may provide the control signal to at least one pixel among pixels at the same positions in three (n=3) pixel units consecutively arranged in the second direction at a time point different from those for the other pixels, thereby reducing an interval between the average times of the pixel units (e.g., first to third pixel units PU1, PU2, and PU3) consecutively arranged in the second direction. An average time of the first pixel unit PU1 is 2, an average time of the second pixel unit PU2 is 2, an average time of the third pixel unit PU3 is 4, an average time of a fourth pixel unit PU4 is 6, and an average time of a fifth pixel unit PU5 is 6. Therefore, compared with FIGS. 7A and 7B, even though the row driver 120 (see FIG. 1) simultaneously provides the control signal to pixels in more horizontal lines, an interval between the average times of each of the first pixel unit PU1, the second pixel unit PU2, the third pixel unit PU3, the fourth pixel unit PU4, and the fifth pixel unit PU5 consecutively arranged in the column direction and a neighboring pixel unit PU is not greater than 2. Therefore, a flicker noise may be alleviated or prevented.

Referring to FIGS. 9A to 9D, a time interval between the first time point t1 at which the row driver 120 (see FIG. 1) provides the control signal to pixels positioned in the odd vertical lines C1, C3, C5, C7, C9, C11, C13, and C15 in three (n=3) consecutive odd horizontal lines, i.e., the first, third, and fifth horizontal lines R1, R3, and R5, included in the first horizontal group RG1 and the third time point t3 at which the row driver 120 (see FIG. 1) provides the control signal to pixels positioned in the even vertical lines C2, C4, C6, C8, C10, C12, and C14 in three (n=3) consecutive even horizontal lines, i.e., the fourth, sixth, and eighth horizontal lines R4, R6, and R8, included in the third horizontal group RG3 may be 2. Further, a time interval between the third time point t3 at which the row driver 120 (see FIG. 1) provides the control signal to the pixels positioned in the even vertical lines C2, C4, C6, C8, C10, C12, and C14 in the three (n=3) consecutive even horizontal lines, i.e., the fourth, sixth, and eighth horizontal lines R4, R6, and R8, included in the third horizontal group RG3 and the fifth time point t5 at which the row driver 120 (see FIG. 1) provides the control signal to pixels positioned in the odd vertical lines C1, C3, C5, C7, C9, C11, C13, and C15 in three (n=3) consecutive odd horizontal lines, i.e., the seventh, ninth, and eleventh horizontal lines R7, R9, and R11, included in a fourth horizontal group (not shown) may be 2 as well. The first horizontal line, i.e., the seventh horizontal line R7, of the fourth horizontal group (not shown) is an odd horizontal line next to the last horizontal line, i.e., the fifth horizontal line R5, of the first horizontal group RG1.

Figure 10A:
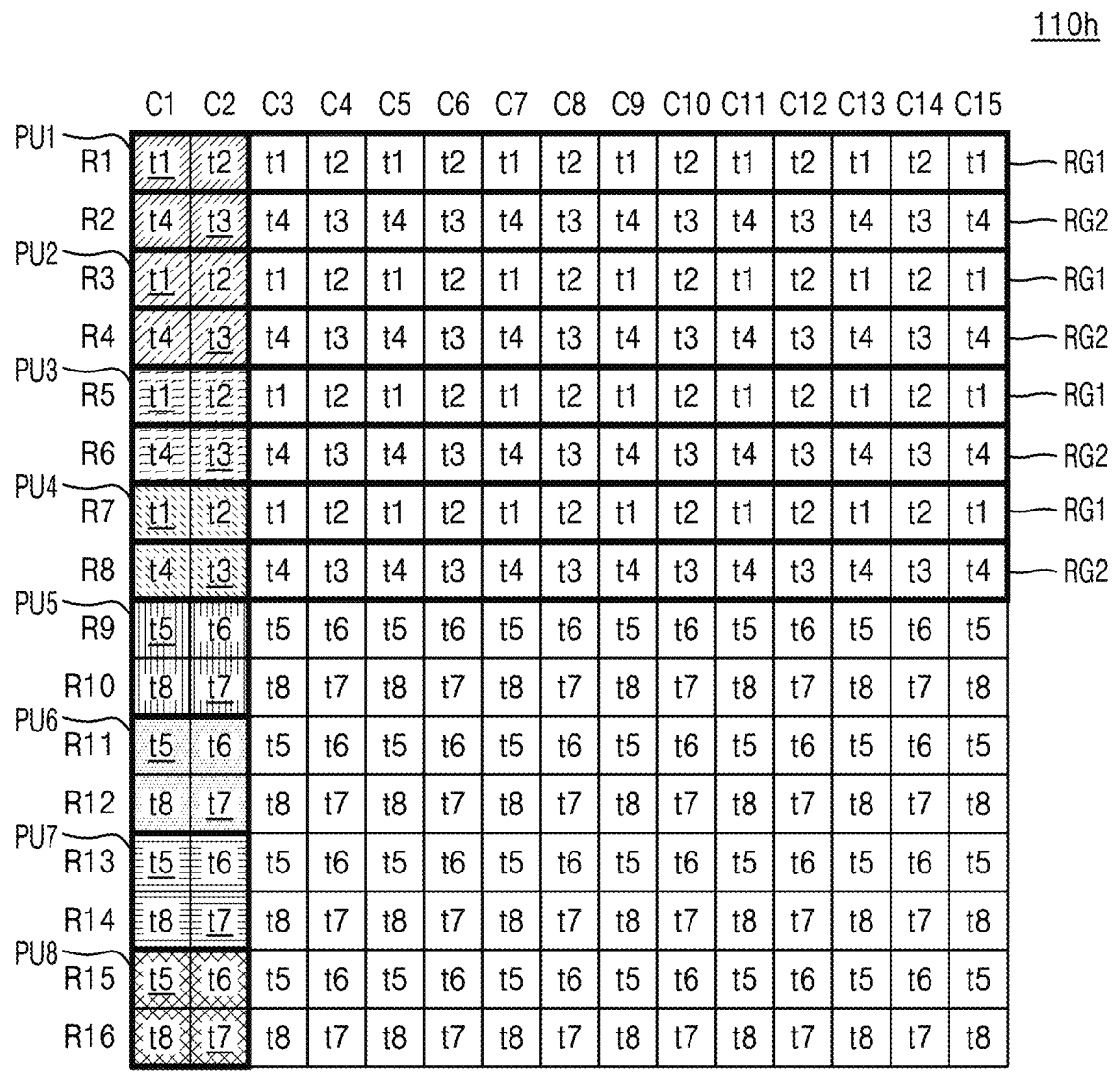
Figure 10B:
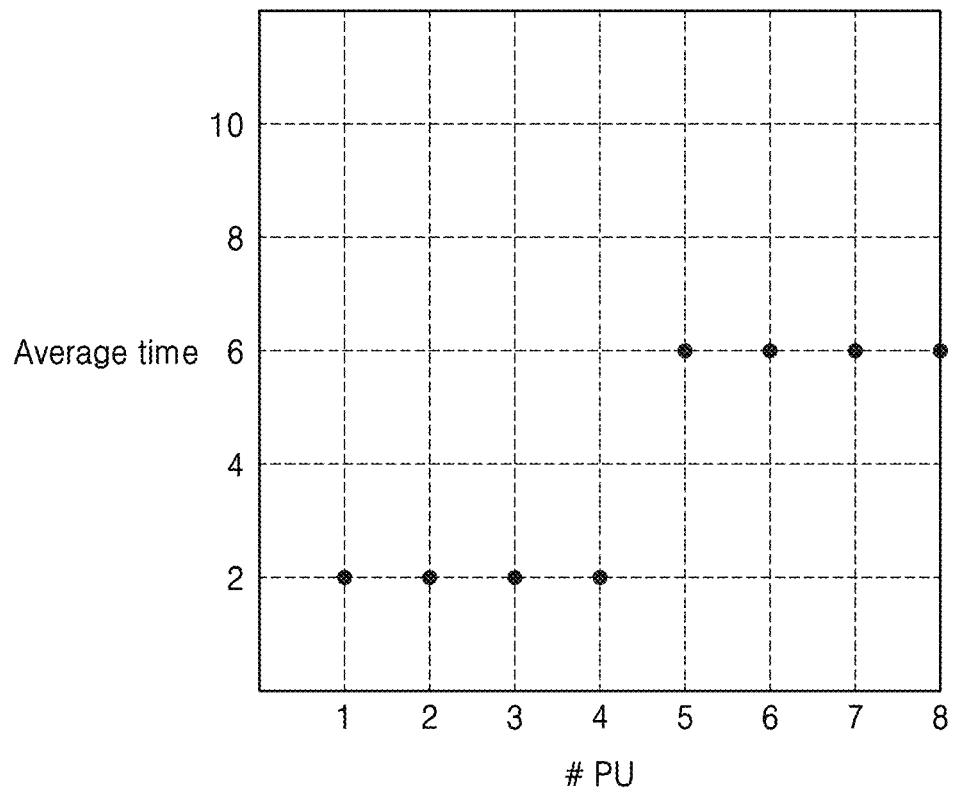

FIG. 10A and FIG. 10B illustrate a readout scheme according to a comparative example.

FIG. 10A illustrates a pixel array 110h including 16 horizontal lines, i.e., first to sixteenth horizontal lines R1 to R16, and 15 vertical lines, i.e., the first to fifteenth vertical lines C1 to C15.

As shown in FIG. 10A, a control signal may be simultaneously provided to four (n=4) horizontal lines.

Referring to FIG. 10A, at the first time point t1, the control signal may be provided to pixels positioned in the odd vertical lines C1, C3, C5, C7, C9, C11, C13, and C15 in a first horizontal group RG1 including four (n=4) consecutive odd horizontal lines, i.e., the first, third, fifth, and seventh horizontal lines R1, R3, R5, and R7, and at the second time point t2, the control signal may be provided to pixels positioned in the even vertical lines C2, C4, C6, C8, C10, C12, and C14 in the first horizontal group RG1 including the four consecutive odd horizontal lines, i.e., the first, third, fifth, and seventh horizontal lines R1, R3, R5, and R7. At the third time point t3, the control signal may be provided to pixels positioned in the even vertical lines C2, C4, C6, C8, C10, C12, and C14 in a second horizontal group RG2 including four consecutive even horizontal lines, i.e., the second, fourth, sixth, and eighth horizontal lines R2, R4, R6, and R8. At the fourth time point t4, the control signal may be provided to pixels positioned in the odd vertical lines C1, C3, C5, C7, C9, C11, C13, and C15 in the second horizontal group RG2 including the four consecutive even horizontal lines, i.e., the second, fourth, sixth, and eighth horizontal lines R2, R4, R6, and R8.

Thereafter, an order in which the control signal may be provided to a plurality of pixels from the fifth time point t5 to the eighth time point t8 may be similar to the control signal provision order is from the first time point t1 to the fourth time point t4.

Referring to FIG. 10A and FIG. 10B, an average time of each of a first pixel unit PU1, a second pixel unit PU2, a third pixel unit PU3, and a fourth pixel unit PU4 is 2, and an average time of each of a fifth pixel unit PU5, a sixth pixel unit PU6, a seventh pixel unit PU7, and an eighth pixel unit PU8 is 6. Therefore, interval between the average times of the fourth pixel unit PU4 and the fifth pixel unit PU5 is the maximum interval, and the maximum interval is 4.

FIG. 11A, FIG. 11B, FIG. 11C, FIG. 11D, FIG. 11E, and FIG. 11F illustrate a readout scheme according to an embodiment.

FIG. 11A illustrates a pixel array 110i including 16 horizontal lines, i.e., the first to sixteenth horizontal lines R1 to R16, and 15 vertical lines, i.e., the first to fifteenth vertical lines C1 to C15.

Referring to FIG. 11A, like FIG. 10A, a control signal may be simultaneously provided to four (n=4) horizontal lines.

Referring to FIG. 11A, the row driver 120 (see FIG. 1) may provide the control signal to pixels positioned in the odd vertical lines C1, C3, C5, C7, C9, C11, C13, and C15 in a first horizontal group RG1 including four consecutive odd horizontal lines, i.e., the first, third, fifth, and seventh horizontal lines R1, R3, R5, and R7, at the first time point t1.

Referring to FIG. 11B, the row driver 120 (see FIG. 1) may provide the control signal to pixels positioned in the even vertical lines C2, C4, C6, C8, C10, C12, and C14 in a second horizontal group RG2 including four consecutive odd horizontal lines, i.e., the third, fifth, seventh, and ninth horizontal lines R3, R5, R7, and R9, at the second time point t2.

Referring to FIG. 11C, the row driver 120 (see FIG. 1) may provide the control signal to pixels positioned in the even vertical lines C2, C4, C6, C8, C10, C12, and C14 in a third horizontal group RG3 including four consecutive even horizontal lines, i.e., the sixth, eighth, tenth, and twelfth horizontal lines R6, R8, R10, and R12, at the third time point t3.

Referring to FIG. 11D, the row driver 120 (see FIG. 1) may provide the control signal to pixels positioned in the odd vertical lines C1, C3, C5, C7, C9, C11, C13, and C15 in a fourth horizontal group RG4 including four consecutive even horizontal lines, i.e., the eighth, tenth, twelfth, and fourteenth horizontal lines R8, R10, R12, and R14, at the fourth time point t4.

Referring to FIG. 11E, the pixel array 110i may include six dummy row lines, i.e., the first horizontal line R1, the second horizontal line R2, the third horizontal line R3, the fourth horizontal line R4, the fifth horizontal line R5, and the sixth horizontal line and R6. That is, the pixel array 110i may include six dummy horizontal lines.

An order in which the row driver 120 (see FIG. 1) provides the control signal from the fifth time point t5 to the eighth time point t8 may be similar to the control signal provision order from the first time point t1 to the fourth time point t4.

Figure 11F:
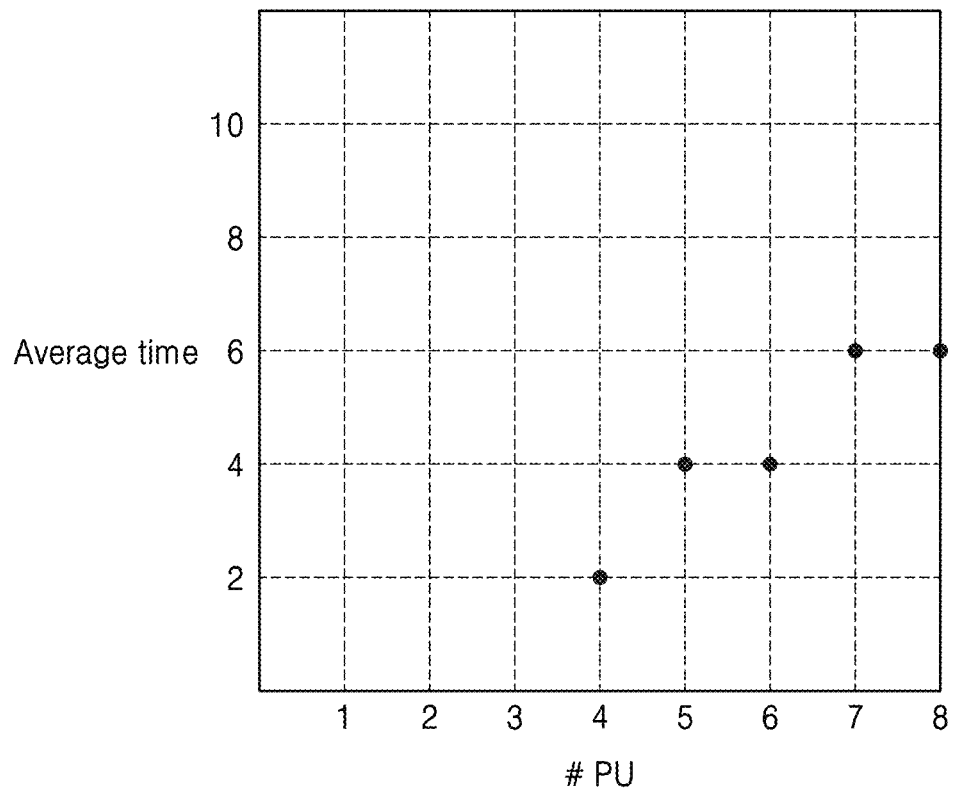

Referring to FIGS. 11E and 11F, some of pixels included in a first pixel unit PU1, a second pixel unit PU2, and a third pixel unit PU3 are positioned in the dummy row lines.

Therefore, the pixels included in the first pixel unit PU1, the second pixel unit PU2, and the third pixel unit PU3 may not be included in a final image. An average time of a fourth pixel unit PU4 is 2, an average time of each of a fifth pixel unit PU5 and a sixth pixel unit PU6 is 4, and an average time of each of a seventh pixel unit PU7 and an eighth pixel unit PU8 is 6. Therefore, the maximum interval between the average times is not greater than 2. When comparing FIG. 11F to FIG. 10B, both FIGS. 10B and 11F employ a multi-row readout scheme in which a control signal is simultaneously provided to pixels positioned in four horizontal lines, but the case of FIG. 11F according to the sliding readout scheme has a maximum interval between the average times that is less than the case of FIG. 10B, thereby obtaining an improved image with alleviated or prevented flicker noise.

Referring to FIG. 11A and FIG. 11C, the first horizontal group RG1 includes four (n=4) consecutive odd horizontal lines, the third horizontal group RG3 includes four (n=4) consecutive even horizontal lines, and each of the four horizontal lines included in the first horizontal group RG1 may be separated by a five-row interval from a corresponding one of the four horizontal lines included in the third horizontal group RG3. According to another embodiment, each of four consecutive odd horizontal lines included in a horizontal group may be separated by a row interval of three horizontal lines to seven (2*n−1) horizontal lines, inclusive, from a corresponding one of four consecutive even horizontal lines included in another horizontal group.

Referring to FIGS. 11A to 11E, an interval between the average time of the first time point t1 at which the row driver 120 (see FIG. 1) provides the control signal to pixels positioned in the odd vertical lines C1, C3, C5, C7, C9, C11, C13, and C15 in four (n=4) consecutive odd horizontal lines, i.e., the first, third, fifth, and seventh horizontal lines R1, R3, R5, and R7, included in the first horizontal group RG1 and the average time of the third time point t3 at which the row driver 120 (see FIG. 1) provides the control signal to pixels positioned in the even vertical lines C2, C4, C6, C8, C10, C12, and C14 in four (n=4) consecutive even horizontal lines, i.e., the sixth, eighth, tenth, and twelfth horizontal lines R6, R8, R10, and R12, included in the third horizontal group RG3 may be 2. Further, an interval between the average time of the third time point t3 at which the row driver 120 (see FIG. 1) provides the control signal to the pixels positioned in the even vertical lines C2, C4, C6, C8, C10, C12, and C14 in the four (n=4) consecutive even horizontal lines, i.e., the sixth, eighth, tenth, and twelfth horizontal lines R6, R8, R10, and R12, included in the third horizontal group RG3 and the average time of the fifth time point t5 at which the row driver 120 (see FIG. 1) provides the control signal to pixels positioned in the odd vertical lines C1, C3, C5, C7, C9, C11, C13, and C15 in four (n=4) consecutive odd horizontal lines, i.e., the ninth, eleventh, thirteenth, and fifteenth horizontal lines R9, R11, R13, and R15, included in a fifth horizontal group (not shown) may be 2 as well. The first horizontal line, i.e., the ninth horizontal line R9, of the fifth horizontal group (not shown) may be an odd horizontal line next to the last horizontal line, i.e., the seventh horizontal line R7, of the first horizontal group RG1.

Figure 12B:
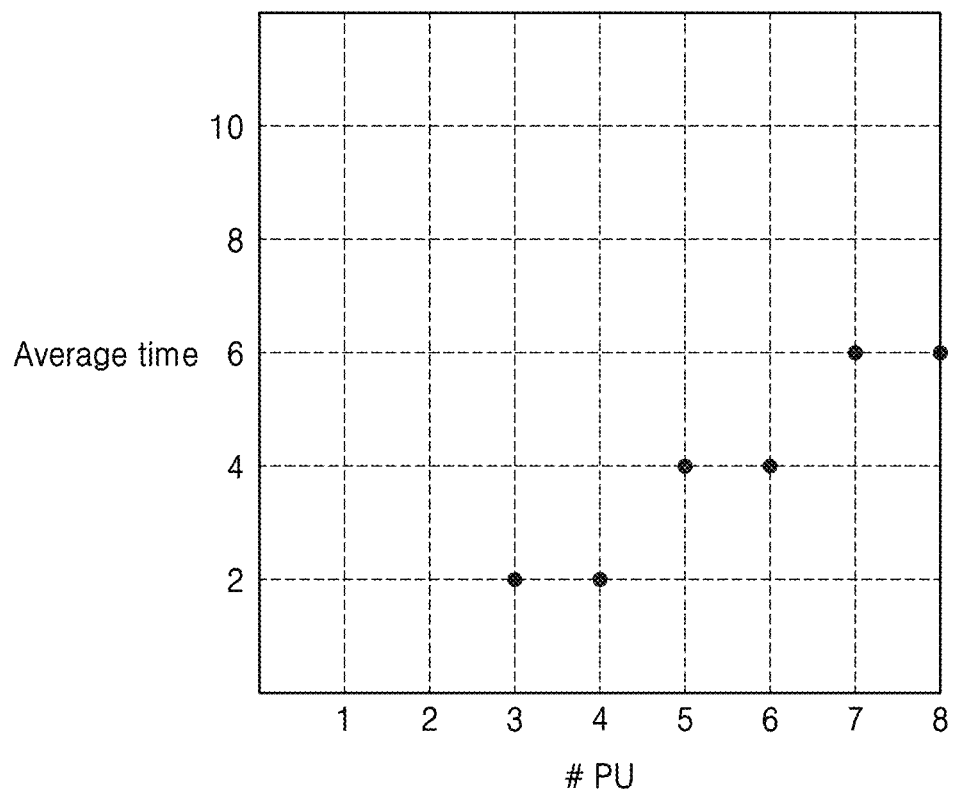

FIG. 12A and FIG. 12B illustrate a readout scheme according to an embodiment.

FIG. 12A and FIG. 12B may be described with reference to components illustrated in FIGS. 11A to 11E, and redundant descriptions thereof may be omitted herein.

Referring to FIG. 12A, a control signal may be simultaneously provided to four (n=4) horizontal lines. According to the sliding readout scheme of FIG. 12A, the pixel array 110$j$ may include four dummy horizontal lines including the first horizontal line R1, the second horizontal line R2, the third horizontal line R3, and the fourth horizontal line R4.

Referring to FIG. 12A, from the first time point t1 to the third time point t3, the control signal may be provided to pixels in the same manner as described with reference to FIGS. 11A to 11C. At the fourth time point t4, a fourth horizontal group may include four consecutive even horizontal lines, i.e., the sixth, eighth, tenth, and twelfth horizontal lines R6, R8, R10, and R12. Therefore, at the fourth time point t4, the control signal may be provided to pixels positioned in the odd vertical lines C1, C3, C5, C7, C9, C11, C13, and C15 in the horizontal lines included in the fourth horizontal group.

Although FIG. 12B may be similar to FIG. 11F, because the pixel array 110$j$ (see FIG. 12A) includes four dummy row lines, pixel signals may be output from pixels included in a third pixel unit PU3 (see FIG. 12A), and thus, FIG. 12B illustrates a graph to which an average time of the third pixel unit PU3 (see FIG. 12A) is reflected.

Figure 13B:
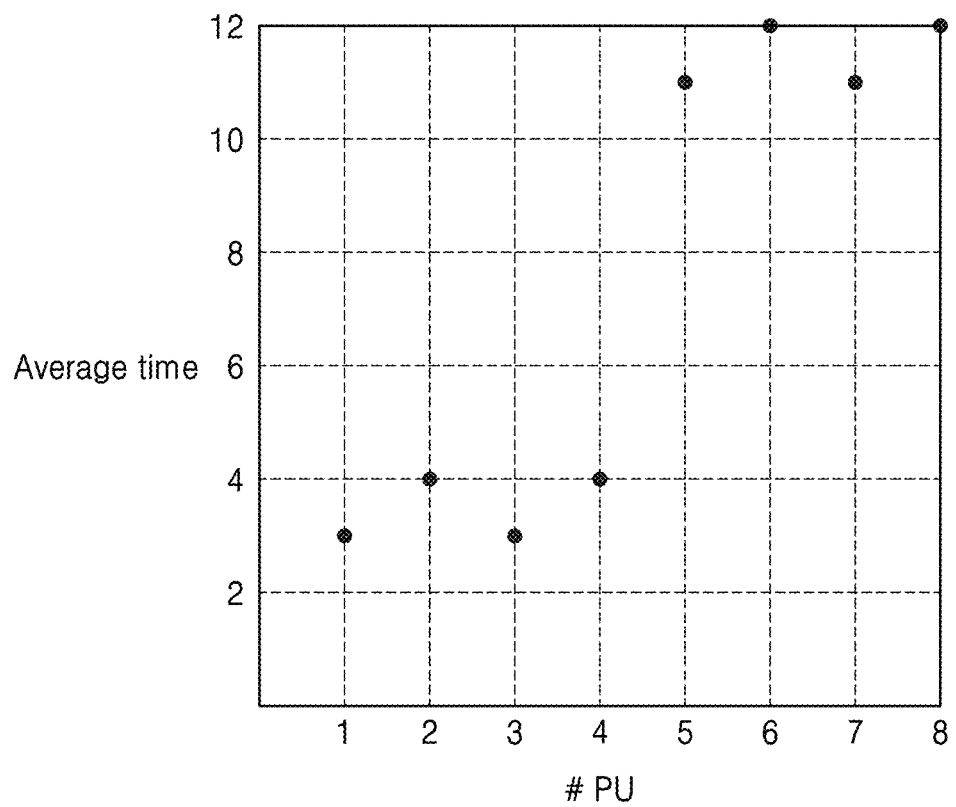

FIG. 13A and FIG. 13B illustrate a readout scheme according to a comparative example.

FIG. 13A may be described with reference to components illustrated in FIG. 3, and redundant descriptions thereof may be omitted herein.

A pixel array 110$k$ of FIG. 13A may operate in a two-binning (m=2) mode.

As described herein with reference to FIG. 3, pixels (e.g., the pixels 31 and 32 of FIG. 3) at the same positions in two pixel units (e.g., the first and second pixel units PU1 and PU2 of FIG. 3) consecutively arranged in the column direction may share one column line (e.g., the (1-1)st column line CL11 of FIG. 3). Therefore, when the pixel array 110$b$ (see FIG. 3) operates in the normal mode, the pixel 31 and the pixel 32 of FIG. 3 cannot simultaneously output pixel signals via the (1-1)st column line CL11 but may output the pixel signals by receiving a control signal at different time points. For example, the pixel 31 (see FIG. 3) may output a pixel signal via the (1-1)st column line CL11 by receiving the control signal at a first time point, and the pixel 32 (see FIG. 3) may output a pixel signal via the (1-1)st column line CL11 by receiving the control signal at a second time point that is different from the first time point.

Therefore, the control signal cannot be simultaneously provided to pixels at the same positions in two (m=2) pixel units consecutively arranged in the second direction, and the control signal may be simultaneously provided to pixels at the same positions in two pixel units (e.g., first and third pixel units PU1 and PU3) separated from each other by one pixel unit in the second direction.

Referring to FIG. 13A, at the first time point t1, the control signal may be provided to pixels positioned in the odd vertical lines C1, C3, C5, C7, C9, C11, C13, and C15 in a first horizontal group RG1 including two odd horizontal lines, i.e., the first and fifth horizontal lines R1 and R5, separated from each other by a four-row interval.

Herein, n horizontal lines included in a horizontal group may be separated from each other by a 2*m interval. For example, the first horizontal line R1 and the fifth horizontal line R5 included in the first horizontal group RG1 are separated from each other by a four-row interval.

At the second time point t2, the control signal may be provided to pixels positioned in the odd vertical lines C1, C3, C5, C7, C9, C11, C13, and C15 in a second horizontal group RG2 including two odd horizontal lines, i.e., the third and seventh horizontal lines R3 and R7, separated from each other by a four-row interval. As described herein, the third horizontal line R3 and the seventh horizontal line R7 included in the second horizontal group RG2 may have a four (2*m, m=2)-row interval therebetween.

At the third time point t3, the control signal may be provided to pixels positioned in the odd vertical lines C1, C3, C5, C7, C9, C11, C13, and C15 in a third horizontal group RG3 including two even horizontal lines, i.e., the second and sixth horizontal lines R2 and R6, separated from each other by a four-row interval. As described herein, the second horizontal line R2 and the sixth horizontal line R6 included in the third horizontal group RG3 may have a four-row interval therebetween.

At the fourth time point t4, the control signal may be provided to pixels positioned in the odd vertical lines C1, C3, C5, C7, C9, C11, C13, and C15 in a fourth horizontal group RG4 including two even horizontal lines, i.e., the fourth and eighth horizontal lines R4 and R8, separated from each other by a four-row interval. As described herein, the fourth horizontal line R4 and the eighth horizontal line R8 included in the fourth horizontal group RG4 may have a four-row interval therebetween.

At the fifth time point t5, the control signal may be provided to pixels positioned in the even vertical lines C2, C4, C6, C8, C10, C12, and C14 in the third horizontal group RG3 including two even horizontal lines, i.e., the second and sixth horizontal lines R2 and R6, separated from each other by a four-row interval.

At the sixth time point t6, the control signal may be provided to pixels positioned in the even vertical lines C2, C4, C6, C8, C10, C12, and C14 in the fourth horizontal group RG4 including two even horizontal lines, i.e., the fourth and eighth horizontal lines R4 and R8, separated from each other by a four-row interval.

At the seventh time point t7, the control signal may be provided to pixels positioned in the even vertical lines C2, C4, C6, C8, C10, C12, and C14 in the first horizontal group RG1 including two odd horizontal lines, i.e., the first and fifth horizontal lines R1 and R5, separated from each other by a four-row interval.

At the eighth time point t8, the control signal may be provided to pixels positioned in the even vertical lines C2, C4, C6, C8, C10, C12, and C14 in the second horizontal group RG2 including two odd horizontal lines, i.e., the third and seventh horizontal lines R3 and R7, separated from each other by a four-row interval.

Thereafter, an order in which the control signal may be provided to a plurality of pixels from ninth time point t9 to sixteenth time point t16 may be similar to the control signal provision order from the first time point t1 to the eighth time point t8.

Referring to FIG. 13B and FIG. 13A, an average time of each of a first pixel unit PU1 and a third pixel unit PU3 is 3, an average time of each of a second pixel unit PU2 and a fourth pixel unit PU4 is 4, an average time of each of a fifth pixel unit PU5 and a seventh pixel unit PU7 is 11, and an average time of each of a sixth pixel unit PU6 and an eighth pixel unit PU8 is 12. Therefore, an interval between the average times of the fourth pixel unit PU4 and the fifth pixel unit PU5 consecutively arranged in the column direction is the maximum interval between the average times, and the maximum interval is 7.

FIG. 14A, FIG. 14B, FIG. 14C, and FIG. 14D illustrate a readout scheme according to an embodiment.

FIGS. 14A to 14D may be described with reference to components illustrated in FIG. 13A and FIG. 13B, and redundant descriptions thereof may be omitted herein.

Referring to FIGS. 14A to 14D, a pixel array 110*l* may operate in the two-binning (m=2) mode. The row driver 120 (see FIG. 1) may simultaneously provide a control signal to pixels positioned in two (n=2) horizontal lines among a plurality of pixels included in the pixel array 110*l* when the pixel array 110*l* operates in the normal mode. That is, the row driver 120 (see FIG. 1) may simultaneously provide the control signal to pixels positioned in two (n=2) horizontal lines to read out, by the sliding readout scheme, pixels included in the pixel array 110*l* that is a two-binning (m=2) pixel array operating in the normal mode.

FIG. 14A illustrates the pixel array 110*l* that is a two-binning (m=2) pixel array including horizontal lines and vertical lines. For example, the pixel array 110*l* may include 16 horizontal lines, i.e., the first to sixteenth horizontal lines R1 to R16, and 15 vertical lines, i.e., the first to fifteenth vertical lines C1 to C15. The row driver 120 (see FIG. 1) may simultaneously provide the control signal to two (n=2) horizontal lines included in the pixel array 110*l*.

Referring to FIG. 14A, the row driver 120 (see FIG. 1) may provide the control signal to pixels positioned in the odd vertical lines C1, C3, C5, C7, C9, C11, C13, and C15 in a first horizontal group RG1 including two odd horizontal lines, i.e., the first and fifth horizontal lines R1 and R5, at the first time point t1.

The row driver 120 (see FIG. 1) according to the inventive concept may simultaneously provide the control signal to pixels positioned in n horizontal lines included in an m-binning pixel array. A horizontal group may include n horizontal lines, and the n horizontal lines may be separated from each other by a 2*m-row interval. For example, the first horizontal line R1 and the fifth horizontal line R5 included in the first horizontal group RG1 may be separated from each other by a four-row interval.

Referring to FIG. 14A, the row driver 120 (see FIG. 1) may provide the control signal to pixels positioned in the odd vertical lines C1, C3, C5, C7, C9, C11, C13, and C15 in a second horizontal group RG2 including two odd horizontal lines, i.e., the third and seventh horizontal lines R3 and R7, at the second time point t2. As described herein, the third horizontal line R3 and the seventh horizontal line R7 included in the second horizontal group RG2 may have a four (2*m, m=2)-row interval therebetween.

The row driver 120 (see FIG. 1) may provide the control signal to pixels positioned in the odd vertical lines C1, C3, C5, C7, C9, C11, C13, and C15 in a third horizontal group RG3 including two even horizontal lines, i.e., the fourth and eighth horizontal lines R4 and R8, at the third time point t3. As described herein, the fourth horizontal line R4 and the eighth horizontal line R8 included in the third horizontal group RG3 may have a four-row interval there between.

The row driver 120 (see FIG. 1) may provide the control signal to pixels positioned in the odd vertical lines C1, C3, C5, C7, C9, C11, C13, and C15 in a fourth horizontal group RG4 including two even horizontal lines, i.e., the sixth and tenth horizontal lines R6 and R10, at the fourth time point t4. As described herein, the sixth horizontal line R6 and the tenth horizontal line R10 included in the fourth horizontal group RG4 may have a four-row interval there between.

The row driver 120 (see FIG. 1) may provide the control signal to pixels positioned in the even vertical lines C2, C4, C6, C8, C10, C12, and C14 in the fourth horizontal group RG4 including two even horizontal lines, i.e., the sixth and tenth horizontal lines R6 and R10, at the fifth time point t5.

Referring to FIG. 14B, the row driver 120 (see FIG. 1) may provide the control signal to pixels positioned in the even vertical lines C2, C4, C6, C8, C10, C12, and C14 in a fifth horizontal group RG5 including two even horizontal lines, i.e., the eighth and twelfth horizontal lines R8 and R12, at the sixth time point t6.

The row driver 120 (see FIG. 1) may provide the control signal to pixels positioned in the even vertical lines C2, C4, C6, C8, C10, C12, and C14 in a sixth horizontal group RG6 including two odd horizontal lines, i.e., the fifth and ninth horizontal lines R5 and R9, at the seventh time point t7.

The row driver 120 (see FIG. 1) may provide the control signal to pixels positioned in the even vertical lines C2, C4, C6, C8, C10, C12, and C14 in a seventh horizontal group RG7 including two odd horizontal lines, i.e., the seventh and eleventh horizontal lines R7 and R11, at the eighth time point t8.

Referring to FIG. 14C, an order in which the row driver 120 (see FIG. 1) provides the control signal to a plurality of pixels included in the pixel array 110*l* from the ninth time point t9 to the sixteenth time point t16 may be similar to the control signal provision order from the first time point t1 to the eighth time point t8.

Referring to FIGS. 14A to 14C, the interval between the first time point t1 at which the row driver 120 (see FIG. 1) provides the control signal to the pixels positioned in the odd vertical lines C1, C3, C5, C7, C9, C11, C13, and C15 in the first horizontal group RG1 including two (n=2) odd horizontal lines separated by a four-row interval from each other, i.e., the first and fifth horizontal lines R1 and R5, and the fifth time point t5 at which the row driver 120 (see FIG. 1) provides the control signal to the pixels positioned in the even vertical lines C2, C4, C6, C8, C10, C12, and C14 in the fourth horizontal group RG4 including two (n=2) even horizontal lines separated by a four-row interval from each other, i.e., the sixth and tenth horizontal lines R6 and R10, may be 4. Further, the interval between the fifth time point t5 at which the row driver 120 (see FIG. 1) provides the control signal to the pixels positioned in the even vertical lines C2, C4, C6, C8, C10, C12, and C14 in the fourth horizontal group RG4 including two (n=2) even horizontal lines separated by a four-row interval from each other, i.e., the sixth and tenth horizontal lines R6 and R10, and the ninth time point t9 at which the row driver 120 (see FIG. 1) provides the control signal to pixels positioned in the odd vertical lines C1, C3, C5, C7, C9, C11, C13, and C15 in the eighth horizontal group RG8 including two (n=2) odd horizontal lines separated by a four-row interval from each other, i.e., the ninth and thirteenth horizontal lines R9 and R13, may be 4 as well. The first horizontal line, i.e., the ninth horizontal line R9, of the eighth horizontal group RG8 and the first horizontal line, i.e., the first horizontal line R1, of the first horizontal group RG1 may be separated from each other by an eight (2*m*n, m=2, n=2)-row interval.

When the row driver 120 (see FIG. 1) according to the inventive concept simultaneously provides the control signal to pixels positioned in n horizontal lines included in an m-binning pixel array, each of n odd horizontal lines included in one horizontal group and separated from each other by a 2*m-row interval may be separated by between a three-row interval and a (2*m*n−1)-row interval, inclusive, from a corresponding one of n even horizontal lines included in another horizontal group and separated from each other by a 2*m-row interval. For example, referring to FIGS. 14A to 14C, each of two (n=2) odd horizontal lines, i.e., the first and fifth horizontal lines R1 and R5, included in the first horizontal group RG1 and separated from each other by a four (2*m, m=2)-row interval may be separated by a five-row interval from a corresponding one of two (n=2) even horizontal lines, i.e., the sixth and tenth horizontal lines R6 and R10, included in the fourth horizontal group RG4 and separated from each other by a four (2*m, m=2)-row interval.

According to another embodiment, at the fifth time point t5, the row driver 120 (see FIG. 1) may simultaneously provide the control signal to the pixels positioned in the even vertical lines C2, C4, C6, C8, C10, C12, and C14 in two (n=2) horizontal lines separated from each other by a four (2*m, m=2)-row interval and respectively separated from the horizontal lines included in the first horizontal group RG1 by between a three-row interval and a seven (2*m*n−1, m=2, n=2)-row interval, inclusive. For example, the row driver 120 (see FIG. 1) may provide the control signal to the pixels positioned in the even vertical lines C2, C4, C6, C8, C10, C12, and C14 in the fourth horizontal line R4 and the eighth horizontal line R8 or the pixels positioned in the even vertical lines C2, C4, C6, C8, C10, C12, and C14 in the eighth horizontal line R8 and the twelfth horizontal line R12 at the fifth time point t5.

According to an embodiment, when m*n is an even number, if each of n odd horizontal lines separated by a 2*m-row interval from each other and included in one horizontal group is separated by a (2*m*n+2)/2-row interval from a corresponding one of n even horizontal lines separated by a 2*m-row interval from each other and included in another horizontal group, a maximum average time may be the minimum. This would be understood based on the description herein.

Referring to FIG. 14C, the pixel array 110*l* may include four dummy row lines, including the first horizontal line R1, the second horizontal line R2, the third horizontal line R3, and the fourth horizontal line R4. That is, the pixel array 110*l* of FIG. 14C may include four dummy horizontal lines.

The number of dummy row lines included in an m-binning pixel array may vary depending on a row interval between each of n odd horizontal lines separated by a 2*m-row interval from each other and a corresponding one of n even horizontal lines separated by a 2*m-row interval from each other. Referring to the description herein, the number of dummy row lines may vary depending on the row interval, a control signal provision order, the number of horizontal lines to which the control signal is simultaneously provided, and/or the number of pixel units consecutive in the second direction and including pixels connected to one column line. Therefore, the number of dummy row lines included in an m-binning pixel array may between 2 and 2*m*n−1, inclusive, according to a row interval between each of n odd horizontal lines and a corresponding one of n even horizontal lines.

According to the control signal provision order described herein, a time point at which the control signal may be provided to at least one pixel among pixels at the same positions in m pixel units separated by m pixel units from each other in the second direction may differ from time points at which the control signal may be provided to the other pixels. For example, referring to FIG. 14C, at least one of four time points, i.e., the fourth, fifth, seventh, and ninth time points t4, t5, t7, and t9, at which the control signal may be provided to four pixels included in a fifth pixel unit PU5 may differ from four time points, i.e., the first, fourth, fifth, and seventh time points t1, t4, t5, and t7, at which the control signal may be provided to four pixels included in a third pixel unit PU3 separated by two pixel units from the fifth pixel unit PU5 in the second direction. Likewise, at least one of the four time points, i.e., the fourth, fifth, seventh, and ninth time points t4, t5, t7, and t9, at which the control signal may be provided to the four pixels included in the fifth pixel unit PU5 may differ from four time points, i.e., ninth, eleventh, thirteenth, and fifteenth time points t9, t11, t13, and t15, at which the control signal may be provided to four pixels included in a seventh pixel unit PU7 separated by two pixel units from the fifth pixel unit PU5 in the second direction. In particular, at least one of two time points at which the control signal is respectively provided to a first green pixel and a second green pixel in each of m pixel units separated by m pixel units from each other in the second direction may vary. Referring to FIG. 13A, four time points at which the control signal is respectively provided to four pixels included in two (m=2) pixel units separated by m pixel units from each other in the second direction may not vary. For example, four time points, i.e., the first, third, fifth, and seventh time points t1, t3, t5, and t7, at which the control signal may be provided to four pixels included in the first pixel unit PU1 may be respectively identical to four time points, i.e., the first, third, fifth, and seventh time points t1, t3, t5, and t7, at which the control signal may be provided to four pixels included in the third pixel unit PU3 separated by two pixel units from the first pixel unit PU1 in the second direction.

Referring to FIGS. 14A to 14C, the interval between the average time of the first time point t1 at which the row driver 120 (see FIG. 1) provides the control signal to pixels positioned in the odd vertical lines C1, C3, C5, C7, C9, C11, C13, and C15 in two (n=2) odd horizontal lines, i.e., the first and fifth horizontal lines R1 and R5, separated by a four (2*m)-row interval from each other and included in the first horizontal group RG1 and the average time of the fifth time point t5 at which the row driver 120 (see FIG. 1) provides the control signal to pixels positioned in the even vertical lines C2, C4, C6, C8, C10, C12, and C14 in two (n=2) even horizontal lines, i.e., the sixth and tenth horizontal lines R6 and R10, separated by a four-row interval from each other and included in the fourth horizontal group RG4 may be 4. Further, the interval between the average time of the fifth time point t5 at which the row driver 120 (see FIG. 1) provides the control signal to the pixels positioned in the even vertical lines C2, C4, C6, C8, C10, C12, and C14 in two (n=2) even horizontal lines, i.e., the sixth and tenth horizontal lines R6 and R10, separated by a four-row interval from each other and included in the fourth horizontal group RG4 and the average time of the ninth time point t9 at which the row driver 120 (see FIG. 1) provides the control signal to pixels positioned in the odd vertical lines C1, C3, C5, C7, C9, C11, C13, and C15 in two (n=2) odd horizontal lines, i.e., the ninth and thirteenth horizontal lines R9 and R13, separated by a four-row interval from each other and included in the eighth horizontal group RG8 may be 4 as well. The first horizontal line, i.e., the first horizontal line R1, included in the first horizontal group RG1 may be separated by an eight (2*m*n)-row interval from the first horizontal line, i.e., the ninth horizontal line R9, included in the eighth horizontal group RG8.

Figure 14D:
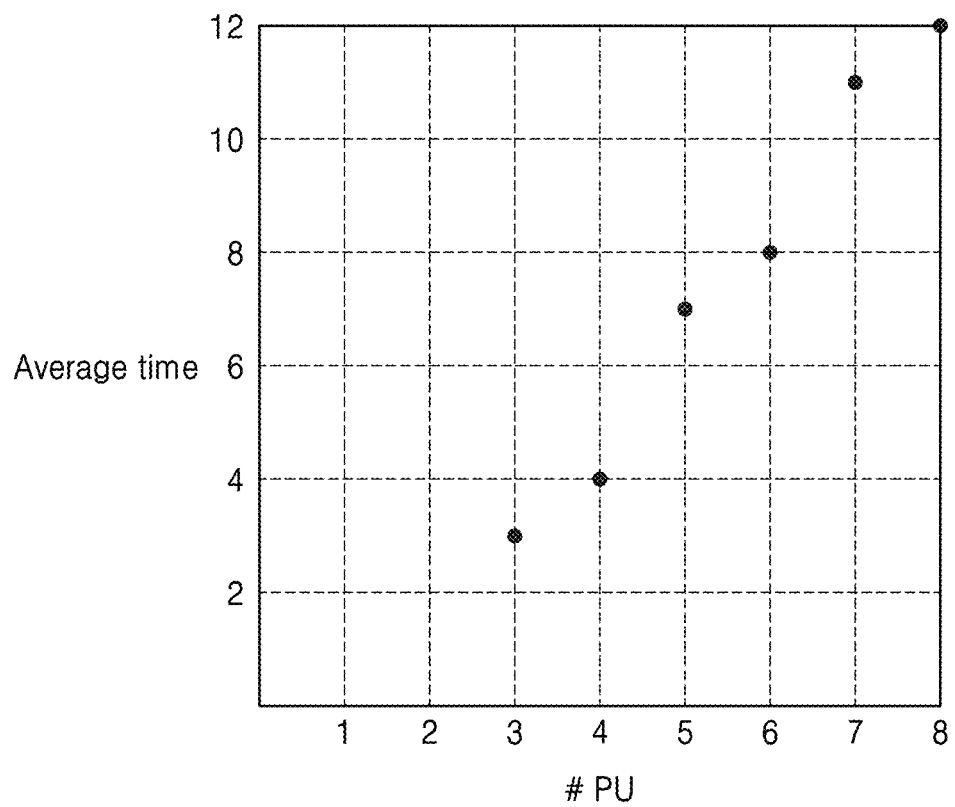

FIG. 14D illustrates a graph showing average times of the third pixel unit PU3 to the eighth pixel unit PU8 based on a time point at which the control signal may be provided to each of the plurality of pixels in FIG. 14C.

Referring to FIG. 14D, a maximum interval between average times is 3, and thus, when compared to FIG. 13B, the maximum interval between average times is reduced, thereby preventing or alleviating a flicker noise.

Figure 15B:
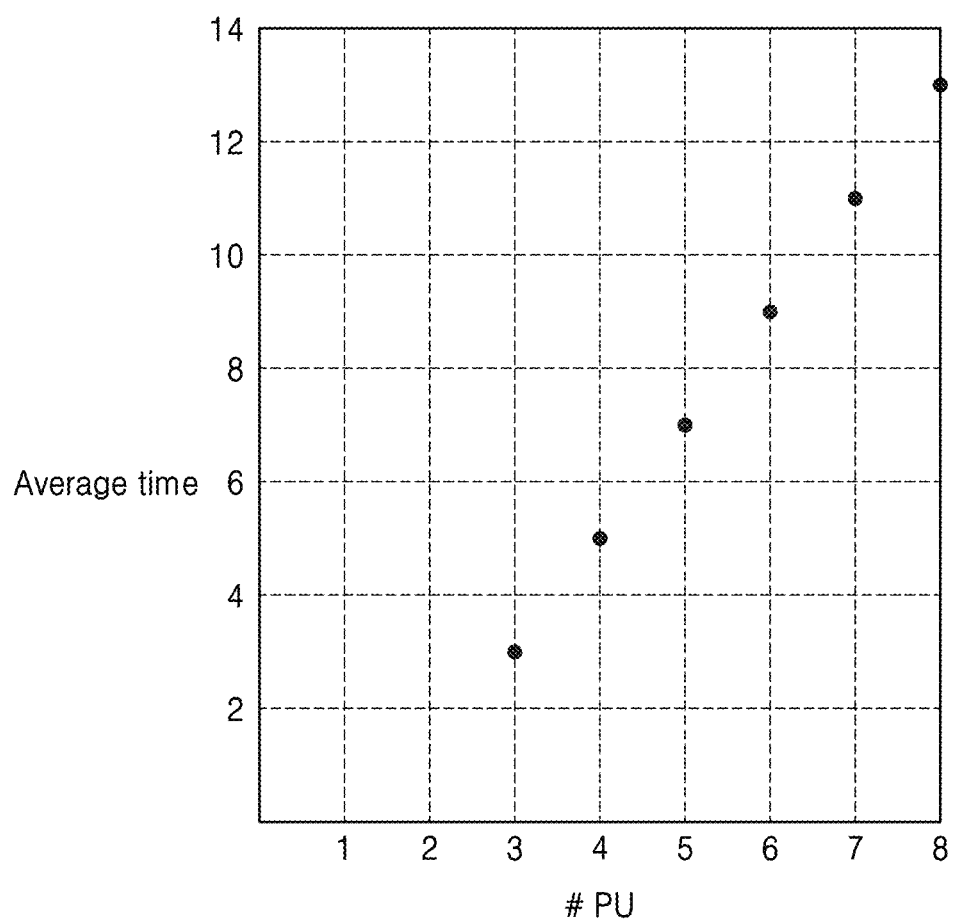

FIG. 15A and FIG. 15B illustrate a readout scheme according to an embodiment.

FIG. 15A may be described with reference to components illustrated in FIGS. 14A to 14C, and redundant descriptions thereof may be omitted herein.

A pixel array 110m may include 16 horizontal lines, i.e., the first to sixteenth horizontal lines R1 to R16, and 15 vertical lines, i.e., the first to fifteenth vertical lines C1 to C15, and is a 2 (m=2)-binning pixel array, a control signal is simultaneously provided to 2 (n=2)-vertical lines. FIG. 15A shows time points at which the control signal is respectively provided to a plurality of pixels included in the pixel array 110m.

Referring to FIG. 15A, the control signal may be provided to pixels positioned in the odd vertical lines C1, C3, C5, C7, C9, C11, C13, and C15 in the fourth horizontal line R4 and the eighth horizontal line R8 at the second time point t2, and the control signal may be provided to pixels positioned in the odd vertical lines C1, C3, C5, C7, C9, C11, C13, and C15 in the third horizontal line R3 and the seventh horizontal line R7 at the third time point t3.

Similarly, referring to FIG. 15A, the control signal may be provided to pixels positioned in the even vertical lines C2, C4, C6, C8, C10, C12, and C14 in the fifth horizontal line R5 and the ninth horizontal line R9 at the sixth time point t6, and the control signal may be provided to pixels positioned in the even vertical lines C2, C4, C6, C8, C10, C12, and C14 in the eighth horizontal line R8 and the twelfth horizontal line R12 at the seventh time point t7.

When comparing FIG. 15A to FIG. 14C, pixels to which the control signal may be provided at the second time point t2 may be exchanged with pixels to which the control signal may be provided at the third time point t3, and pixels to which the control signal may be provided at the sixth time point t6 may be exchanged with pixels to which the control signal may be provided at the seventh time point t7.

Figure 8E:
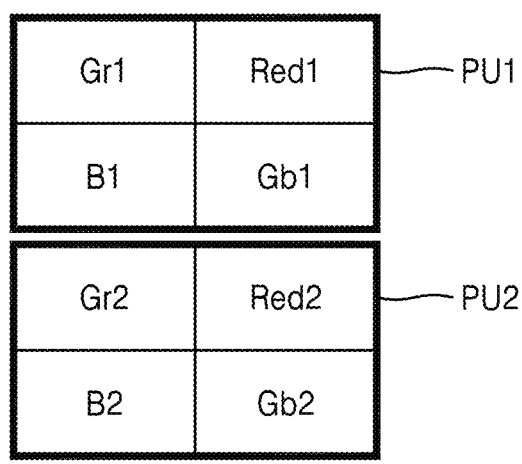
Figure 8F:
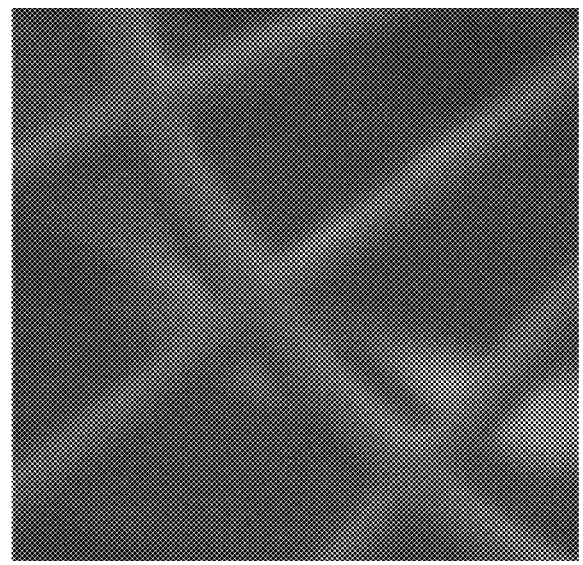

When a temporal order in which the control signal is provided to pixels included in the third pixel unit PU3 and the fourth pixel unit PU4 in FIG. 14C, and these pixels may be arranged according to the patterns of the first pixel unit PU1 and the second pixel unit PU2 in FIG. 8E, the control signal is sequentially provided to a first green pixel Gr1, a first green pixel Gr2, a blue pixel B2, a blue pixel B1, a second green pixel Gb1, a second green pixel Gb2, a red pixel Red1, and a red pixel Red2.

When a temporal order in which the control signal is provided to pixels included in a third pixel unit PU3 and a fourth pixel unit PU4 in FIG. 15A, and these pixels may be arranged according to the patterns of the first pixel unit PU1 and the second pixel unit PU2 in FIG. 8E, the control signal may be sequentially provided to the first green pixel Gr1, the blue pixel B2, the first green pixel Gr2, the blue pixel B1, the second green pixel Gb1, the red pixel Red1, the second green pixel Gb2, and the red pixel Red2.

When the control signal is provided in the order shown in FIG. 15A, the control signal may be provided to the first green pixel Gr2 at an intermediate time point between a time point at which the control signal is provided to the first green pixel Gr1 and a time point at which the control signal is provided to the second green pixel Gb1. In addition, the control signal may be provided to the second green pixel Gb2 at an intermediate time point between a time point at which the control signal is provided to the second green pixel Gb1 and a time point at which the control signal is provided to a first green pixel Gr3 (not shown). Herein, the first green pixel Gr3 (not shown) may indicate a first green pixel included in a third pixel unit (not shown) adjacent to the second pixel unit PU2 of FIG. 8E in the column direction.

Referring to FIG. 15A, an order in which the row driver 120 (see FIG. 1) provides the control signal from the ninth time point t9 to the sixteenth time point t16 may be similar to the control signal provision order from the first time point t1 to the eighth time point t8.

The pixel array 110*m* of FIG. 15A may include four dummy row lines, including the first horizontal line R1, the second horizontal line R2, the third horizontal line R3, and the fourth horizontal line R4. That is, the pixel array 110*m* of FIG. 15A may include four dummy horizontal lines.

Referring to FIG. 15A and FIG. 15B, a first pixel unit PU1 and a second pixel unit PU2 may be included in the dummy row lines, an average time of the third pixel unit PU3 is 3, an average time of the fourth pixel unit PU4 is 5, an average time of a fifth pixel unit PU5 is 7, an average time of a sixth pixel unit PU6 is 9, an average time of a seventh pixel unit PU7 is 11, and an average time of an eighth pixel unit PU8 is 13. Therefore, a maximum interval between the average times of consecutively arranged pixel units is 2. For example, the interval between the average times of the sixth pixel unit PU6 and the seventh pixel unit PU7 may be written as 11−9=2, and no interval between the average times of consecutively arranged pixel units is greater than 2. That is, each interval of FIG. 15B may be equal to 2.

When comparing FIG. 15B to FIG. 13B, both FIGS. 13B and FIG. 15A show average times by a multi-row readout scheme in which the control signal is simultaneously provided to two horizontal lines in a 2-binning pixel array. In the case of FIG. 15B a maximum interval between the average times of consecutively arranged pixel units that is less than the case of FIG. 13B, thereby obtaining an image in which a flicker noise phenomenon may be further alleviated or prevented.

Figure 16:
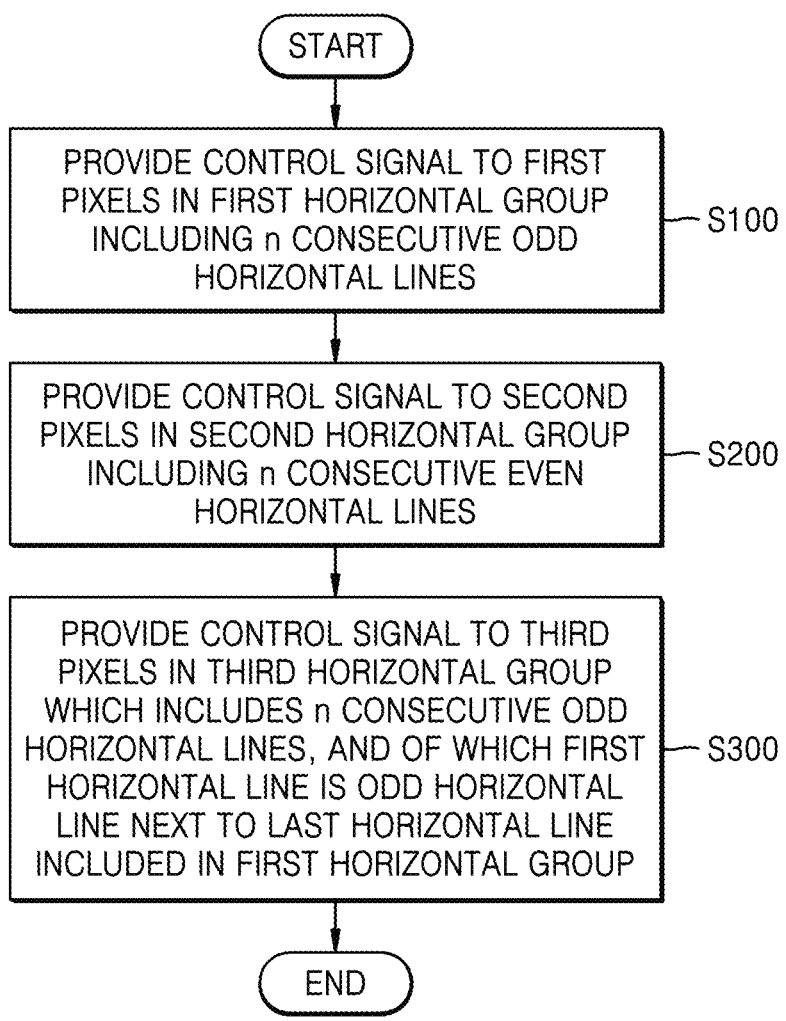
FIG. 16 is a flowchart illustrating a method of operating an image sensor, according to an embodiment.

FIG. 16 is a flowchart illustrating a method of operating an image sensor, according to an embodiment.

In operation S100, the row driver 120 (see FIG. 1) may provide a control signal to first pixels in a first horizontal group including n consecutive odd horizontal lines. Herein, n is an integer greater than 1.

In operation S200, the row driver 120 (see FIG. 1) may provide the control signal to second pixels in a second horizontal group including n consecutive even horizontal lines. Herein, each of the n horizontal lines included in the first horizontal group may be separated by at least a three-row interval from a corresponding one of the n horizontal lines included in the second horizontal group.

In operation S300, the row driver 120 (see FIG. 1) may provide the control signal to third pixels in a third horizontal group including n consecutive odd horizontal lines of which the first horizontal line is an odd horizontal line next to the last low line included in the first horizontal group. Herein, a time interval between a time point at which the row driver 120 (see FIG. 1) provides the control signal to the first pixels and a time point at which the row driver 120 (see FIG. 1) provides the control signal to the second pixels may be substantially the same as a time interval between the time point at which the row driver 120 (see FIG. 1) provides the control signal to the second pixels and a time point at which the row driver 120 (see FIG. 1) provides the control signal to the third pixels, and n may be an integer greater than 1.

While the inventive concept has been particularly shown and described with reference to embodiments thereof, it will be understood that various changes in form and details may be made therein without departing from the spirit and scope of the following claims.

What is claimed is:

1. An image sensor comprising:
a plurality of horizontal lines extending in a first direction;
a plurality of vertical lines extending in a second direction perpendicular to the first direction; a pixel array comprising a plurality of pixels arranged along the plurality of horizontal lines and the plurality of vertical lines; and
a row driver configured to simultaneously provide a control signal to pixels included in n horizontal lines of the plurality of horizontal lines,
wherein the row driver is further configured to provide, at a first time point, the control signal to first pixels in a first horizontal group comprising n consecutive odd horizontal lines of the plurality of horizontal lines,
provide, at a second time point, the control signal to second pixels in a second horizontal group comprising n consecutive even horizontal lines of the plurality of horizontal lines, and
provide, at a third time point, the control signal to third pixels in a third horizontal group comprising n consecutive odd horizontal lines of the plurality of horizontal lines, and of which a first horizontal line is an odd horizontal line next to a last horizontal line included in the first horizontal group,
wherein each of the n horizontal lines included in the first horizontal group is separated by an at least three-row interval from a corresponding one of the n horizontal lines included in the second horizontal group,
a time interval between the first time point and the second time point is equal to a time interval between the second time point and the third time point, and n is an integer greater than 1.

2. The image sensor of claim 1, wherein the pixel array comprises at least two dummy horizontal lines.

3. The image sensor of claim 2, wherein the pixel array comprises 2*n−1 or fewer dummy horizontal lines.

4. The image sensor of claim 1, wherein a row interval between each of the n horizontal lines included in the first horizontal group and a corresponding one of the n horizontal lines included in the second horizontal group is 2*n−1 or fewer horizontal lines.

5. The image sensor of claim 1, wherein the pixel array comprises a plurality of pixel units each comprising four pixels arranged in a 2×2 matrix, and
the row driver is further configured to provide the control signal such that a time point at which the control signal is provided to pixels at a same position in n pixel units consecutive in the second direction differs from time points at which the control signal is provided to other pixels in the n pixel units.

6. The image sensor of claim 5, wherein the four pixels of each of the pixel units share one floating diffusion node.

7. The image sensor of claim 1, wherein the row driver is further configured to provide, at the first time point, the control signal to pixels positioned in odd vertical lines of the plurality of vertical lines among the first pixels in the first horizontal group,
provide, at the second time point, the control signal to pixels positioned in even vertical lines of the plurality of vertical lines among the second pixels in the second horizontal group, and
provide, at the third time point, the control signal to pixels positioned in the odd vertical lines of the plurality of vertical lines among the third pixels in the third horizontal group.

8. The image sensor of claim 1, wherein the row driver is further configured to provide, at the first time point, the control signal to pixels positioned in even vertical lines of the plurality of vertical lines among the first pixels in the first horizontal group, provide, at the second time point, the control signal to pixels positioned in odd vertical lines of the plurality of vertical lines among the second pixels in the second horizontal group, and provide, at the third time point, the control signal to pixels positioned in the even vertical lines of the plurality of vertical lines among the third pixels in the third horizontal group.

9. The image sensor of claim 1, further comprising n column lines connected to pixels of n horizontal lines of the plurality of horizontal lines.

10. The image sensor of claim 9, further comprising a plurality of analog-digital converter circuits each configured to receive a pixel signal from a pixel via a column line of the n column lines, wherein each of the n column lines is connected to one analog-digital converter circuit of the plurality of analog-digital converter circuits.

11. The image sensor of claim 1, wherein the plurality of pixels included in the pixel array are arranged in one of a Bayer pattern, an RGBW pattern, or an RGBY pattern.

12. A method of operating an image sensor comprising a plurality of pixels arranged along a plurality of horizontal lines and a plurality of vertical lines, the method comprising:

providing a control signal to first pixels in a first horizontal group comprising n consecutive odd horizontal lines of the plurality of horizontal lines;

providing the control signal to second pixels in a second horizontal group comprising n consecutive even horizontal lines of the plurality of horizontal lines: and providing the control signal to third pixels in a third horizontal group which comprises n consecutive odd horizontal lines of the plurality of horizontal lines, and of which a first horizontal line is an odd horizontal line next to a last horizontal line included in the first horizontal group, wherein each of the n consecutive odd horizontal lines included in the first horizontal group is separated by an at least three-row interval from a corresponding one of the n consecutive even horizontal lines included in the second horizontal group, a time interval between a time point at which the control signal is provided to the first pixels and a time point at which the control signal is provided to the second pixels is equal to a time interval between the time point at which the control signal is provided to the second pixels and a time point at which the control signal is provided to the third pixels, and n is an integer greater than 1.

* * * * *